US012635298B2

(12) United States Patent
Kim et al.

(10) Patent No.: US 12,635,298 B2
(45) Date of Patent: May 19, 2026

(54) LIGHT EMITTING DEVICE, DISPLAY APPARATUS, AND MANUFACTURING METHOD THEREOF

(71) Applicant: SAMSUNG DISPLAY CO., LTD., Yongin-si (KR)

(72) Inventors: Joosung Kim, Suwon-si (KR); Younghwan Park, Suwon-si (KR); Jinjoo Park, Suwon-si (KR); Dongchul Shin, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 485 days.

(21) Appl. No.: 18/118,993

(22) Filed: Mar. 8, 2023

(65) Prior Publication Data

US 2024/0047614 A1 Feb. 8, 2024

(30) Foreign Application Priority Data

Aug. 2, 2022 (KR) ........................ 10-2022-0096104

(51) Int. Cl.
*H10H 20/825* (2025.01)
*H10H 20/01* (2025.01)
(Continued)

(52) U.S. Cl.
CPC .... *H10H 20/8252* (2025.01); *H10H 20/0137* (2025.01); *H10H 20/811* (2025.01); *H10H 20/8132* (2025.01); *H10H 20/815* (2025.01)

(58) Field of Classification Search
CPC ............. H10H 20/0137; H10H 20/812; H10H 20/815; H10H 20/8132; H10H 20/8133
See application file for complete search history.

(56) References Cited

U.S. PATENT DOCUMENTS 9,859,330 B2 1/2018 Von Malm et al.
10,084,011 B1 9/2018 Sotta et al.
(Continued)

FOREIGN PATENT DOCUMENTS

GB 2586862 A 3/2021
GB 2593693 A 10/2021
KR 10-2012-0129666 A 11/2012

OTHER PUBLICATIONS

Iida, Daisuke et al., "Demonstration of low forward voltage InGaN-based red LEDs," Applied Physics Express, Feb. 11, 2020, vol. 13, No. 031001. (4 pages total).
(Continued)

*Primary Examiner* — Jesse Y Miyoshi
(74) *Attorney, Agent, or Firm* — Sughrue Mion, PLLC

(57) ABSTRACT

A light emitting device includes a light emitting device includes: a first nitride semiconductor layer doped with an n-type dopant and having a first lattice constant; an active layer provided on the first nitride semiconductor layer and having a second lattice constant greater than the first lattice constant, the active layer including a nitride semiconductor material including indium; a stress relaxation layer interposed between the first nitride semiconductor layer and the active layer and having a third lattice constant between the first lattice constant and the second lattice constant, the stress relaxation layer including a nitride semiconductor material including indium; and a second nitride semiconductor layer provide on the active layer and doped with a p-type dopant, wherein the active layer includes: an upper active region provided on an upper surface of the stress relaxation layer, and a side active region provided on a side surface of the stress relaxation layer.

15 Claims, 35 Drawing Sheets

(51) Int. Cl.

| | |
|---|---|
| *H10H 20/811* | (2025.01) |
| *H10H 20/813* | (2025.01) |
| *H10H 20/815* | (2025.01) |

(56)                    References Cited

U.S. PATENT DOCUMENTS

| | | | |
|---|---|---|---|
| 10,707,374 B2 | 7/2020 | Danesh et al. | |
| 2010/0187496 A1* | 7/2010 | Yan .................... | H10H 20/815 |
| | | | 438/47 |
| 2019/0088820 A1* | 3/2019 | Danesh ................ | H01L 25/13 |
| 2019/0341525 A1 | 11/2019 | Danesh et al. | |
| 2020/0227255 A1 | 7/2020 | Zhu et al. | |
| 2021/0057601 A1 | 2/2021 | Oliver et al. | |

OTHER PUBLICATIONS

Auf Der Maur, Matthias et al., "Efficiency Drop in Green InGaN═GaN Light Emitting Diodes: The Role of Random Alloy Fluctuations," Physical Review Letters, Jan. 15, 2016, vol. 116, No. 027401. (5 pages total).

Bulashevich, Kirill A. et al., "Impact of surface recombination on efficiency of III-nitride light-emitting diodes ," Phys. Status Solidi RRL, Apr. 11, 2016, vol. 10, No. 6, pp. 480-484.

Karpov, Sergey Yu., "Effect of Carrier Localization on Recombination Processes and Efficiency of InGaN-Based LEDs Operating in the "Green Gap"," Applied Science, May 18, 2018, vol. 8, No. 818. (15 pages total).

Lu, I-Lin et al., "A study of the role of dislocation density, indium composition on the radiative efficiency in InGaN/GaN polar and nonpolar light-emitting diodes using drift-diffusion coupled with a Monte Carlo method," Journal of Applied Physics, vol. 108, No. 124508, Dec. 15, 2010. (7 pages total).

Communication issued Dec. 21, 2023 by the European Patent Office in European Patent Application No. 23163385.0.

Pasayat et al., "Compliant Micron-Sized Patterned InGaN Pseudo-Substrates Utilizing Porous GaN", Materials, Jan. 1, 2020, 10 total pages, vol. 13, doi:10.3390/ma13010213.

Pasayat et al., "Growth of strain-relaxed InGaN on micrometer-sized patterned compliant GaN pseudo-substrates", Applied Physics Letters, Mar. 16, 2020, 6 total pages, vol. 116, doi:10.1063/5.0001480.

Hwang et al., "Development of InGaN-based red LED grown on (0001) polar surface", Applied Physics Express, Jun. 2014, 5 total pages, vol. 7, doi:10.7567/APEX.7.071003.

Iida et al., "633-nm InGaN-based red LEDs grown on thick underlying GaN layers with reduced inplane residual stress", Applied Physics Letters, Apr. 20, 2020, 6 total pages, doi:10.1063/1.5142538.

* cited by examiner

LIGHT EMITTING DEVICE, DISPLAY APPARATUS, AND MANUFACTURING METHOD THEREOF

CROSS-REFERENCE TO RELATED APPLICATION

This application is based on and claims priority under 35 U.S.C. § 119 to Korean Patent Application No. 10-2022-0096104, filed on Aug. 2, 2022, in the Korean Intellectual Property Office, the disclosure of which is incorporated by reference herein in its entirety.

BACKGROUND

1. Field

The disclosure relates to a light emitting device, a display apparatus, and a manufacturing method thereof.

2. Description of the Related Art

Light-emitting diodes (LEDs) are known as next generation light sources having advantages, such as long lifetime, low power consumption, fast response speed, environment affinity, and the like, when compared to a conventional light source, and an industrial demand is increasing because of these advantages. LEDs are generally applied to and used in various products, such as lighting apparatuses and backlighting of display apparatuses.

Recently, micro-unit or nano-unit ultra-small LEDs using group II-VI or group III-V compound semiconductors have been developed. In addition, micro LED displays have been developed in which such ultra-small LEDs are directly applied as light emitting devices of display pixels. However, when the LEDs are miniaturized in such a micro unit or nano unit, the light emission efficiency of the LEDs may be lowered.

Further, as a material that may be used to extract long-wavelength light, such as green light, a nitride-based material, such as InGaN or a phosphide-based material, such as AlGaInP may be used. However, phosphide-based materials may not be suitable for use in small-sized LEDs, such as micro LEDs, because as the size of the LED decreases, the lower the internal quantum efficiency decreases. Additionally, as the content of In increases in the nitride-based material, a lattice constant difference with respect to the n-GaN layer may increase, and thus lattice defects may occur.

SUMMARY

Provided are a light emitting device capable of emitting high efficiency light and a manufacturing method thereof.

Provided are a light emitting device capable of reducing lattice defects and a manufacturing method thereof.

Provided is a display apparatus capable of emitting high efficiency light.

Additional aspects will be set forth in part in the description which follows and, in part, will be apparent from the description, or may be learned by practice of the presented embodiments of the disclosure.

According to an aspect of an example embodiment, a light emitting device includes: a first nitride semiconductor layer doped with an n-type dopant and having a first lattice constant; an active layer provided on the first nitride semiconductor layer and having a second lattice constant greater than the first lattice constant, the active layer including a nitride semiconductor material including indium; a stress relaxation layer interposed between the first nitride semiconductor layer and the active layer and having a third lattice constant between the first lattice constant and the second lattice constant, the stress relaxation layer including a nitride semiconductor material including indium; and a second nitride semiconductor layer provide on the active layer and doped with a p-type dopant, wherein the active layer includes: an upper active region provided on an upper surface of the stress relaxation layer, and a side active region provided on a side surface of the stress relaxation layer.

In the stress relaxation layer, a fourth lattice constant of a region facing the active layer may be greater than a fifth lattice constant of a region facing the first nitride semiconductor layer, and a difference between the fourth lattice constant and the fifth lattice constant in the stress relaxation layer may be about 1% or more of the first lattice constant.

In the active layer, a thickness of the side active region may be less than a thickness of the upper active region.

The light emitting device may include a first passivation layer on a side surface of the first nitride semiconductor layer, where the side active region may contact the first passivation layer.

The side active region may extend to contact a side surface of the first nitride semiconductor layer.

The stress relaxation layer may include InGaN, and the active layer may include InGaN.

An indium content of the stress relaxation layer may be less than an indium content of the active layer.

The active layer may include an indium content of about 20% or more such that the active layer is configured to emit long-wavelength light.

A width of the active layer may be about 10 μm or less.

The second nitride semiconductor layer may be on the upper active region.

The active layer may include a plurality of active layers spaced apart from each other.

Each of the plurality of active layers may have different widths.

The second nitride semiconductor layer may connect the plurality of active layers to each other.

The stress relaxation layer may include a superlattice layer including a plurality of thin film layers having a thickness of about 10 nm or less.

The stress relaxation layer may include a single layer having an indium content of about 20% or less and a thickness of about 10 nm or less.

According to an aspect of an example embodiment, a method of manufacturing a light emitting device, includes: forming, on a substrate, a first nitride semiconductor base layer including an n-type doped nitride semiconductor material; growing a stress base layer on the first nitride semiconductor base layer, the stress base layer including a nitride semiconductor material including indium; forming a stress relaxation layer by etching the stress base layer; growing an active layer on an upper surface and a side surface of the stress relaxation layer, wherein the active layer at least partially surrounds the stress relaxation layer, and the active layer includes the nitride semiconductor material including indium; and growing, on the active layer, a second nitride semiconductor layer including a p-type doped nitride semiconductor material.

During the etching of the stress base layer, a lattice constant may increase in an upper region of the stress base layer.

Etching of the stress base layer may include patterning the first nitride semiconductor base layer as a first nitride semiconductor layer having a width corresponding to the stress relaxation layer.

In the stress relaxation layer, a difference between a lattice constant of the upper region and a lattice constant of a lower region may be about 1% or more of a lattice constant of the first nitride semiconductor layer.

Growing the active layer may include forming an upper active region on the upper surface of the stress relaxation layer, and forming a side active region on the side surface of the stress relaxation layer.

A thickness of the side active region may be less than a thickness of the upper active region.

The method may include, prior to growing the active layer, forming a first passivation layer to at least partially surround a side surface of the first nitride semiconductor base layer.

The active layer may extend to contact a side surface of the first nitride semiconductor base layer.

The active layer may include an indium content of about 20% or more such that the active layer is configured to emit long-wavelength light.

A width of the active layer may be about 10 μm or less.

According to an aspect of an example embodiment, a display apparatus includes: a light emitting device including: a first nitride semiconductor layer doped with an n-type dopant and having a first lattice constant; an active layer provided on the first nitride semiconductor layer and having a second lattice constant greater than the first lattice constant, the active layer including a nitride semiconductor material including indium; a stress relaxation layer interposed between the first nitride semiconductor layer and the active layer and having a third lattice constant between the first lattice constant and the second lattice constant, the stress relaxation layer including a nitride semiconductor material including indium; and a second nitride semiconductor layer provided on the active layer and doped with a p-type dopant, wherein the active layer includes an upper active region provided on an upper surface of the stress relaxation layer, and a side active region provided on a side surface of the stress relaxation layer.

BRIEF DESCRIPTION OF THE DRAWINGS

The above and other aspects, features, and advantages of embodiments of the disclosure will be more apparent from the following description taken in conjunction with the accompanying drawings, in which:

FIG. 15 is a diagram illustrating a portion of a display apparatus including a nitride semiconductor layer according to an embodiment;

DETAILED DESCRIPTION

Figure 1A:
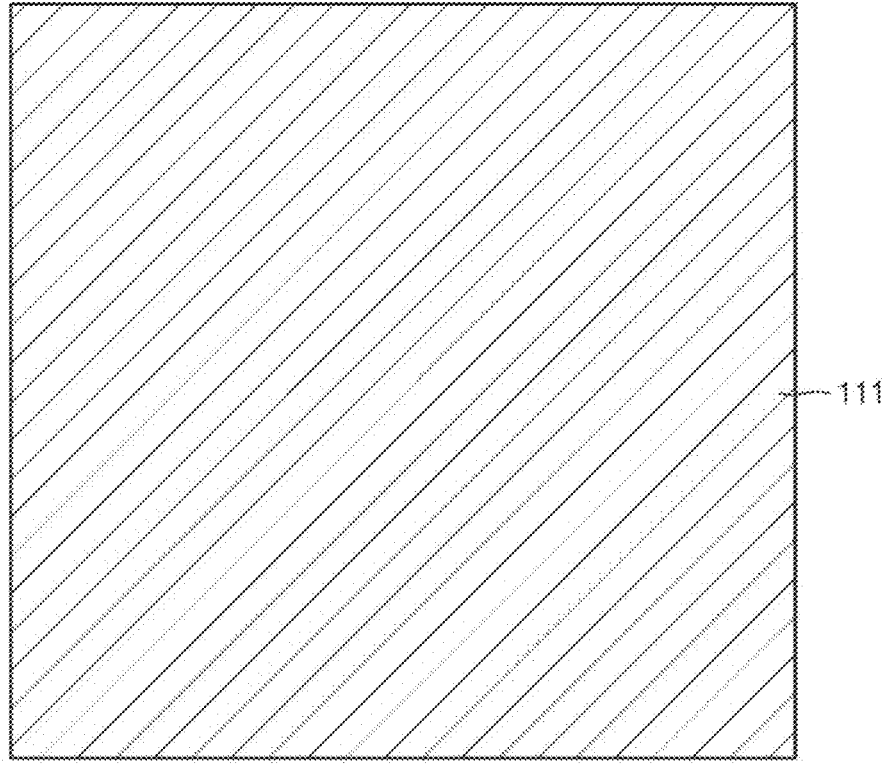
FIGS. 1A, 1B, 1C, 1D, 1E 1F, 1G and 1H are cross-sectional views illustrating a method of manufacturing a light emitting device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a light emitting device, a display apparatus, and a manufacturing method thereof according to various embodiments will be described in detail with reference to the accompanying drawings. In the following drawings, the same reference numerals refer to the same components, and the size of each component in the drawings may be exaggerated for clarity and convenience of description. The terms first, second, etc. may be used to describe various components, but the components should not be limited by terms. Terms are used only for the purpose of distinguishing one component from another component.

The singular expression includes plural expressions unless the context clearly implies otherwise. In addition, when a part "includes" a component, this means that it may further include other components, not excluding other components unless otherwise opposed. In the drawings, the size or thickness of each component may be exaggerated for clarity. In addition, when a predetermined material layer is described as being present on a substrate or another layer, the material layer may directly contact the substrate or another layer, or another third layer may be present therebetween. In addition, since the material forming each layer in the following embodiment is exemplary, other materials may be used.

The specific executions described in this embodiment are examples, and do not limit the technical scope in any way. For the simplicity of the specification, the description of conventional electronic configurations, control systems, software, and other functional aspects of the systems may be omitted. in addition, the connection or connection members of lines between the components shown in the drawings exemplarily represent functional connection and/or physical or circuit connections, and may be replaceable or represented as various additional functional connections, physical connections, or circuit connections in an actual device.

The use of the term "the" and similar indicative terms may correspond to both singular and plural.

Steps constituting the method may be performed in an appropriate order unless there is a clear statement that the steps should be performed in the order described. In addition, the use of all illustrative terms (e.g., etc.) is simply intended to detail technical ideas and, unless limited by the claims, the scope of rights is not limited due to the terms.

FIGS. 1A, 1B, 1C, 1D, 1E, 1F, 1G and 1H are cross-sectional views illustrating a method of manufacturing a light emitting device 100 according to an embodiment.

Referring to FIG. 1A, a first nitride semiconductor base layer 111 is provided. The first nitride semiconductor base layer 111 may be formed on a substrate. The substrate may be a substrate for growing the light emitting device 100 (see FIG. 1F). For example, the substrate may be a silicon substrate or a sapphire substrate.

The first nitride semiconductor base layer 111 may include a semiconductor material doped with a first conductivity type. For example, the first nitride semiconductor base layer 111 may include an n-type doped nitride semiconductor material. For example, the first nitride semiconductor base layer 111 may include n-type doped gallium nitride (n-GaN).

However, the material of the first nitride semiconductor base layer 111 is not limited thereto and may be various. For example, the first nitride semiconductor base layer 111 may include a semiconductor layer that includes at least one of InAlGaN, GaN, AlGaN, and InGaN, and is doped with a conductive type, such as Si, Ge, Sn, etc.

Figure 1B:
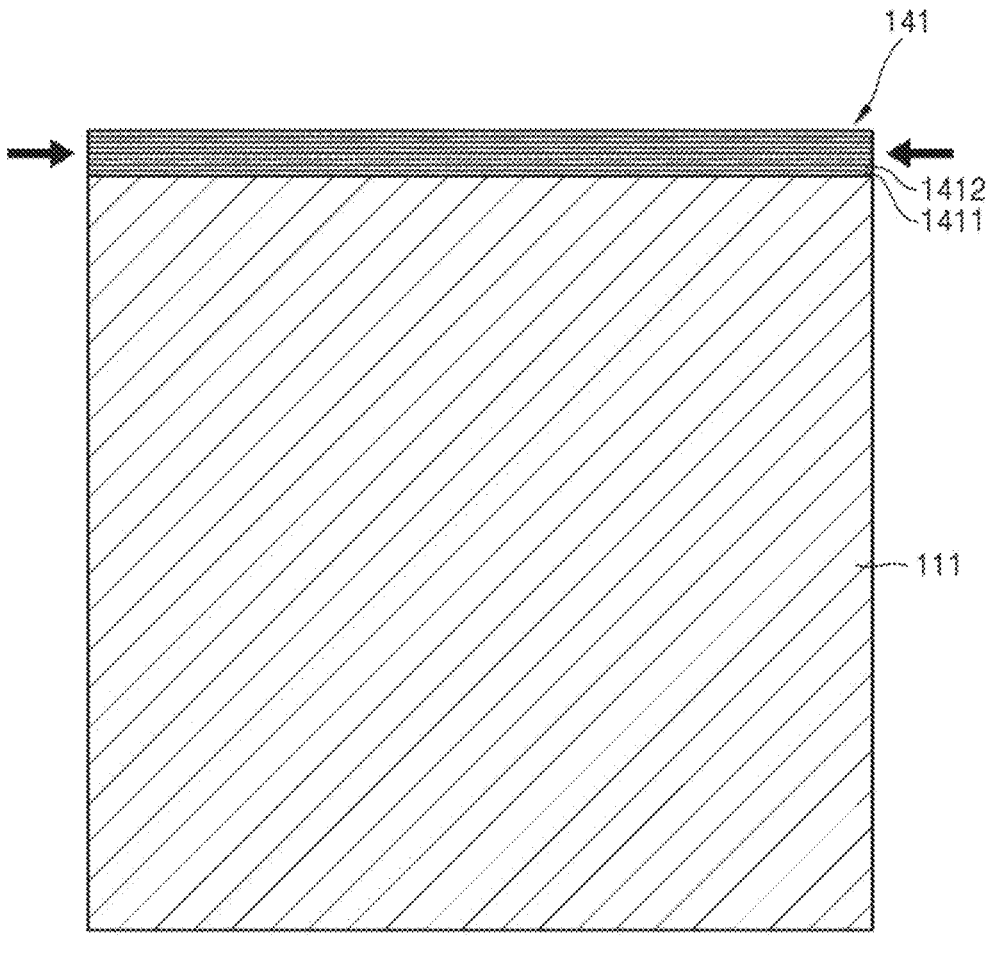

Referring to FIG. 1B, a stress base layer 141 is grown on the first nitride semiconductor base layer 111.

The stress base layer 141 may be grown on the first nitride semiconductor base layer 111 by a metal organic chemical vapor deposition (MOCVD) method. However, the growth method of the stress base layer 141 is not limited thereto, and various methods may be used. For example, the stress base layer 141 may be formed on the first nitride semiconductor base layer 111 using a method, such as chemical vapor deposition (CVD), plasma enhanced chemical vapor deposition (PECVD), molecular beam epitaxy (MBE), hydride vapor phase epitaxy (HYPE), or the like.

The stress base layer 141 may include a semiconductor material different from the first nitride semiconductor base layer 111. The stress base layer 141 may include a nitride semiconductor material having a lattice constant greater than that of the first nitride semiconductor base layer 111.

The stress base layer 141 may include a nitride semiconductor material including indium. For example, the stress base layer 141 may include a semiconductor material of any one of InAlGaN, InGaN, and InN. For example, the stress base layer 141 may include InGaN.

The stress base layer 141 may have a multi-layer structure. For example, the stress base layer 141 may be a superlattice layer including two or more thin film layers 1411 and 1412. Each of the thin film layers 1411 and 1412 may be selected below a critical thickness. For example, the thickness of each of the thin film layers 1411 and 1412 may be 10 nm or less. Each of the thin film layers 1411 and 1412 may be two-dimensionally epitaxially grown. For example, the stress base layer 141 may have a structure in which a thin film layer 1411 including GaN and a thin film layer 1412 including InGaN are alternately stacked. As another example, the stress base layer 141 may have a structure in which a plurality of thin film layers 1411 and 1412 including InGaN having different indium content are alternately stacked.

An indium content of the stress base layer 141 may be less than about %. For example, the indium content of the stress base layer 141 may be about 20% or less. For example, the stress base layer 141 may include $In_xGa_{(1-x)}N$ ($0.05 \leq x < 0.30$). For example, the stress base layer 141 may include $In_xGa_{(1-x)}N$ ($0.05 \leq x \leq 0.20$). For example, the thin film layers 1411 and 1412 of the stress base layer 141 may include $In_xGa_{(1-x)}N$ ($0.05 \leq x < 0.30$). For example, the thin film layers 1411 and 1412 of the stress base layer 141 may include $In_xGa_{(1-x)}N$ ($0.05 \leq x \leq 0.20$).

The first nitride semiconductor base layer 111 may not include indium or may include an indium content lower than the indium content of the stress base layer 141. In other words, the indium content of the stress base layer 141 is higher than the indium content of the first nitride semiconductor base layer 111.

As the indium content in the nitride semiconductor material increases, the lattice constant may increase. Accordingly, the lattice constant of the nitride semiconductor material having a relatively large indium content is greater than the lattice constant of the nitride semiconductor material having a relatively low indium content. Accordingly, since the nitride semiconductor material of the stress base layer 141 has a lattice constant greater than the nitride semiconductor material of the first nitride semiconductor base layer 111, a compressive stress may be applied to the stress base layer 141 grown on the first nitride semiconductor base layer 111, as indicated by arrows in FIG. 1B. In other words, a compressive stress may be applied to the stress base layer 141 due to a lattice constant difference between the stress base layer 141 and the first nitride semiconductor base layer 111 during the growth of the stress base layer 141. The stress base layer 141 may be a strained layer. Accordingly, the lattice constant of the stress base layer 141 may correspond to the lattice constant of the first nitride semiconductor base layer 111. The lattice constant of the lower region facing the first nitride semiconductor base layer 111 and the lattice constant of the upper region far from the first nitride semiconductor base layer 111 in the stress base layer 141 may correspond to the lattice constant of the first nitride semiconductor base layer 111. A difference between the lattice constant of the stress base layer 141 and the lattice constant of the first nitride semiconductor base layer 111 may be less than 2% of the lattice constant of the first nitride semiconductor base layer 111.

Figure 1C:
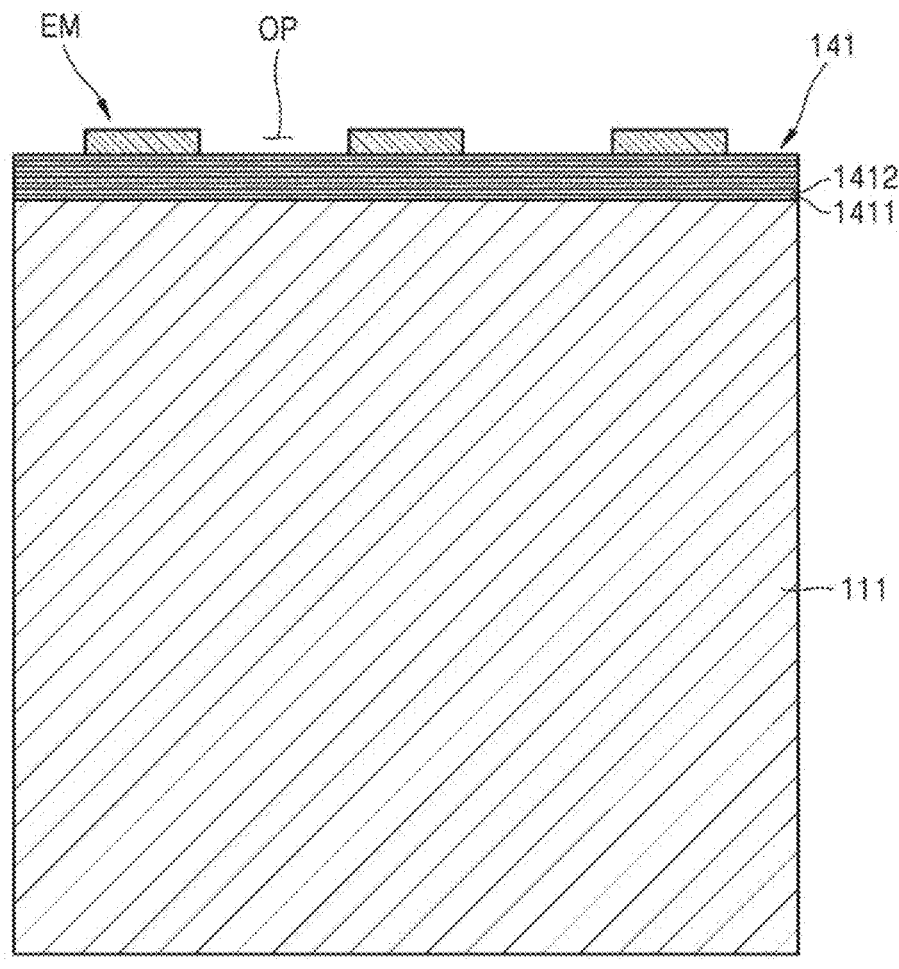
Figure 1D:
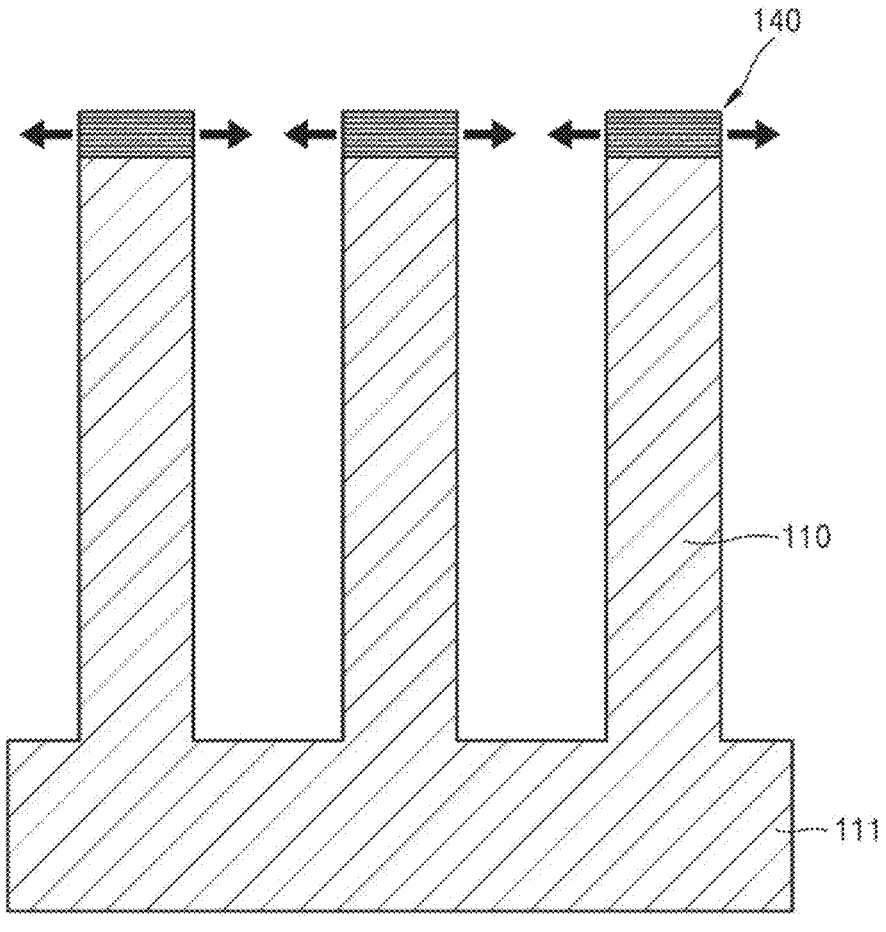

Next, referring to FIGS. 1C and 1D, a stress relaxation layer 140 is formed by etching the stress base layer 141 to relax the compressive stress of the stress base layer 141. In an embodiment, although the compressive stress is relaxed as an example of the stress relaxation layer 140, the stress relaxation layer 140 is not necessarily limited thereto, and the tensile stress may be relaxed according to the material of each layer and the lattice constant.

A dry etching method may be used as an etching method for forming the stress relaxation layer 140. For example, the stress relaxation layer 140 may be formed by a dry etching method using plasma.

For example, as illustrated in FIG. 1C, after the stress base layer 141 is formed, an etching mask EM having a plurality of openings OP may be arranged on the stress base layer 141. For example, after the material of the etching mask EM is entirely formed on the upper surface of the stress base layer 141, the material of the etching mask EM may be patterned to have the plurality of openings OP using a lithography method to form the etching mask EM having the plurality of openings OP. The etching mask EM may have a plurality of openings two-dimensionally arranged when viewed from the top.

Thereafter, regions not covered by the etching mask EM in the stress base layer 141 may be etched and removed by a dry etching method. For example, the stress base layer 141 and the first nitride semiconductor base layer 111 under the opening OP of the etching mask EM may be sequentially dry-etched and removed. The etching mask EM is removed after dry etching.

As shown in FIG. 1D, the stress relaxation layer 140 and the first nitride semiconductor layer 110 may be formed by etching. The stress relaxation layer 140 may include a plurality of stress relaxation layers 140 spaced apart from each other. The stress relaxation layer 140 may have a predetermined width by etching. For example, the width of the stress relaxation layer 140 may be about 100 μm or less. For example, the width of the stress relaxation layer 140 may be about 20 μm or less. For example, the width of the stress relaxation layer 140 may be about 10 μm or less. For example, the width of the stress relaxation layer 140 may be about 1 μm or less. The width of the stress relaxation layer 140 may be determined by the width of the etching mask EM. The width of the stress relaxation layer 140 may refer to the width of each of the plurality of stress relaxation layers 140 when there are a plurality of stress relaxation layers 140 as shown in the drawing, and means the width of the stress relaxation layer 140 when the stress relaxation layer 140 is singular.

In an embodiment, a dry etching using plasma is illustrated as an etching method for forming the stress relaxation layer 140, but the etching method is not limited thereto, and may be variously applied as long as it is etched to mitigate stress of the stress base layer 141. For example, the etching method for forming the stress relaxation layer 140 may be a wet etching method instead of a dry etching method, or a dry etching method and a wet etching method may be sequentially used.

By the etching process, when the stress base layer 141 is patterned into the stress relaxation layer 140, the stress applied to the stress base layer 141 may be relaxed or mitigated, as indicated by arrows in FIG. 1D.

The width of the stress relaxation layer 140 may be determined according to a degree to which stress relaxation is required. The width of the stress relaxation layer 140 may be determined according to a wavelength of light required by the light emitting device 100.

The degree of stress relaxation may be greater in the upper region of the stress base layer 141 than in the lower region thereof. As the stress applied to the stress base layer 141 is relaxed, the lattice constant of the upper region of the stress base layer 141 may increase. In other words, the upper region of the stress relaxation layer 140 may have a lattice constant greater than the lower region thereof.

In the stress relaxation layer 140, a difference between the lattice constant of the upper region and the lattice constant of the lower region may be about 1% or more of the lattice constant of the first nitride semiconductor layer 110. In the stress relaxation layer 140, a difference between the lattice constant of the upper region and the lattice constant of the lower region may be about 2% or more of the lattice constant of the first nitride semiconductor layer 110. However, in the stress relaxation layer 140, a difference between the lattice constant of the upper region and the lattice constant of the lower region may be about 5% or less of the lattice constant of the first nitride semiconductor layer 110.

The layer structure of the stress relaxation layer 140 may be the same as the layer structure of the stress base layer 141. The stress relaxation layer 140 may be a superlattice layer including a plurality of thin film layers having a thickness of 10 nm or less.

Figure 2A:
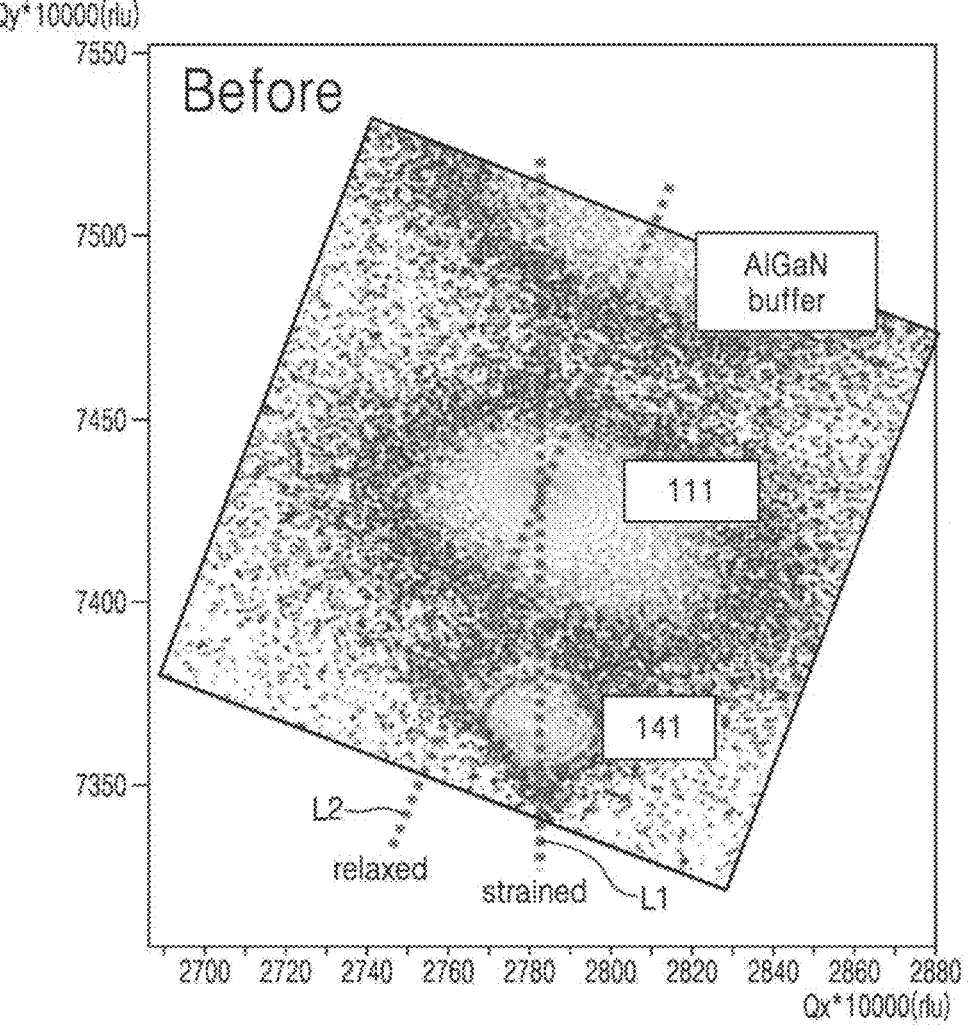
FIGS. 2A and 2B are reciprocal space maps which are obtained by measuring states of a first nitride semiconductor base layer and a stress base layer before and after etching, using X-ray diffraction, according to an embodiment.
Figure 2B:
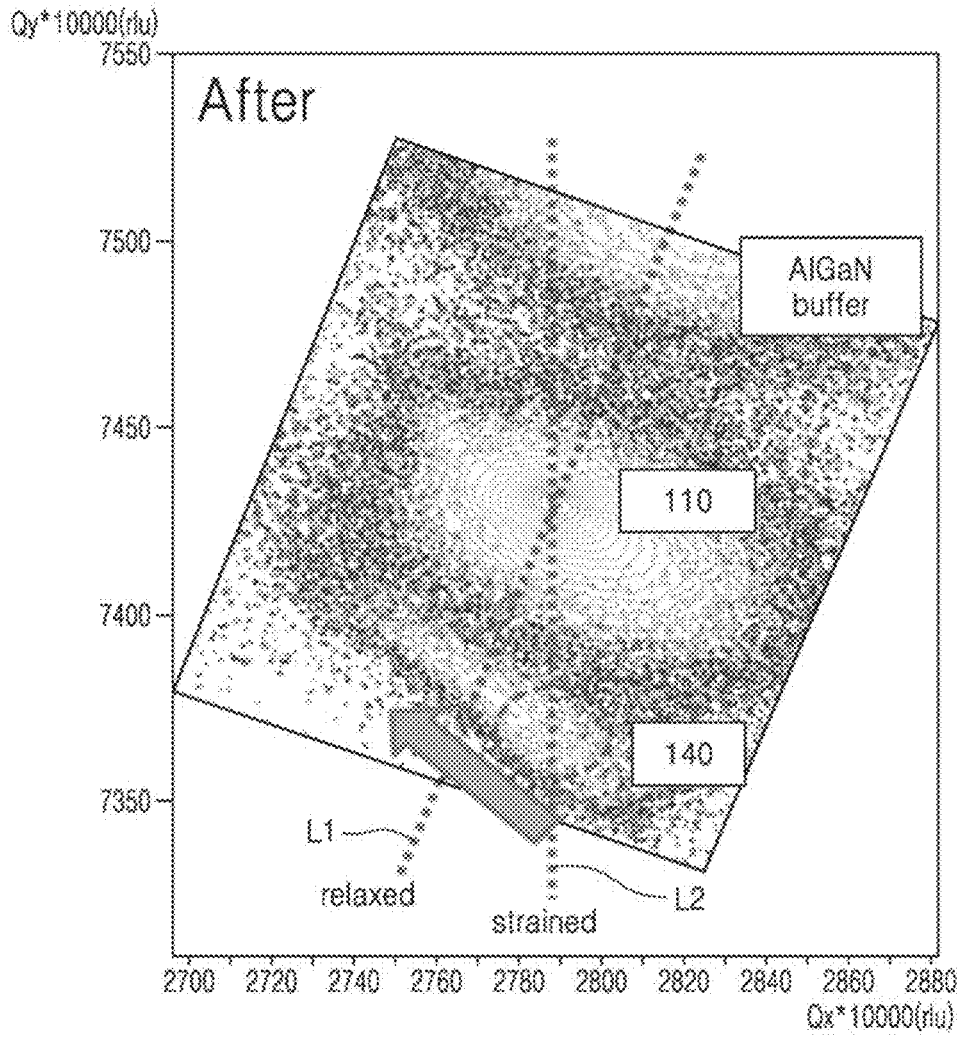

FIGS. 2A and 2B are reciprocal space maps which are obtained by measuring states of a first nitride semiconductor base layer 111 and a stress base layer 141 before and after etching, using X-ray diffraction, according to an embodiment. FIG. 2A illustrates a state in which the stress base layer 141 having a multilayer structure composed of InGaN having an indium content of 5% is grown on the first nitride semiconductor base layer 111 composed of GaN, and FIG. 2B illustrates a state of the first nitride semiconductor layer 110 and the stress relaxation layer 140 patterned by dry etching the first nitride semiconductor base layer 111 and the stress base layer 141 of FIG. 2A. The first nitride semiconductor base layer 111 is formed on the AlGaN buffer layer.

Referring to FIG. 2A, it may be confirmed that the stress base layer 141 grown on the first nitride semiconductor base layer 111 is located on the first line L1 in which the center of the stress base layer 141 indicates the strained state. Referring to FIG. 2B, it may be confirmed that the stress relaxation layer 140 in which the etching process was performed on the stress base layer 141 is located on or close to the second line L2 in which the center of the stress relaxation layer 140 indicates a relaxed state. That is, after the stress base layer 141 is grown, the stress applied to the stress base layer 141 may be relaxed by an etching process for patterning the stress base layer 141 into the stress relaxation layer 140.

A lattice constant of the stress relaxation layer 140 in which stress is relaxed may be different from that of the stress base layer 141 in which stress is not relaxed. For example, the upper region of the stress relaxation layer 140 may have a lattice constant greater than the upper region of the stress base layer 141. For example, the lattice constant of the lower region of the stress relaxation layer 140 may be substantially the same as that of the lower region of the stress base layer 141, and the upper region of the stress relaxation layer 140 may have a lattice constant greater than the upper region of the stress base layer 141. The upper region of the stress relaxation layer 140 may have a lattice constant increased by about 0.01 to about 0.09 than the upper region of the stress base layer 141.

The lattice constant of the upper region of the stress relaxation layer 140 may be greater than the lattice constant of the lower region thereof. A difference between the lattice constant of the upper region and the lattice constant of the lower region may be about 0.01 to about 0.09. A difference between the lattice constant of the upper region and the lattice constant of the lower region may be less than 3% of the lattice constant of the upper region.

As the lattice constant increases in the upper region of the stress relaxation layer 140, defects may be reduced in the active layer 130 grown on the stress relaxation layer 140.

Referring back to FIG. 1D, the first nitride semiconductor layer 110 may have a bar shape having a height greater than a width. A plurality of first nitride semiconductor layers 110 may be provided. The stress relaxation layer 140 may be arranged on each of the plurality of first nitride semiconductor layers 110. The lower portions of the plurality of first nitride semiconductor layers 110 may be connected to each other.

Figure 1E:
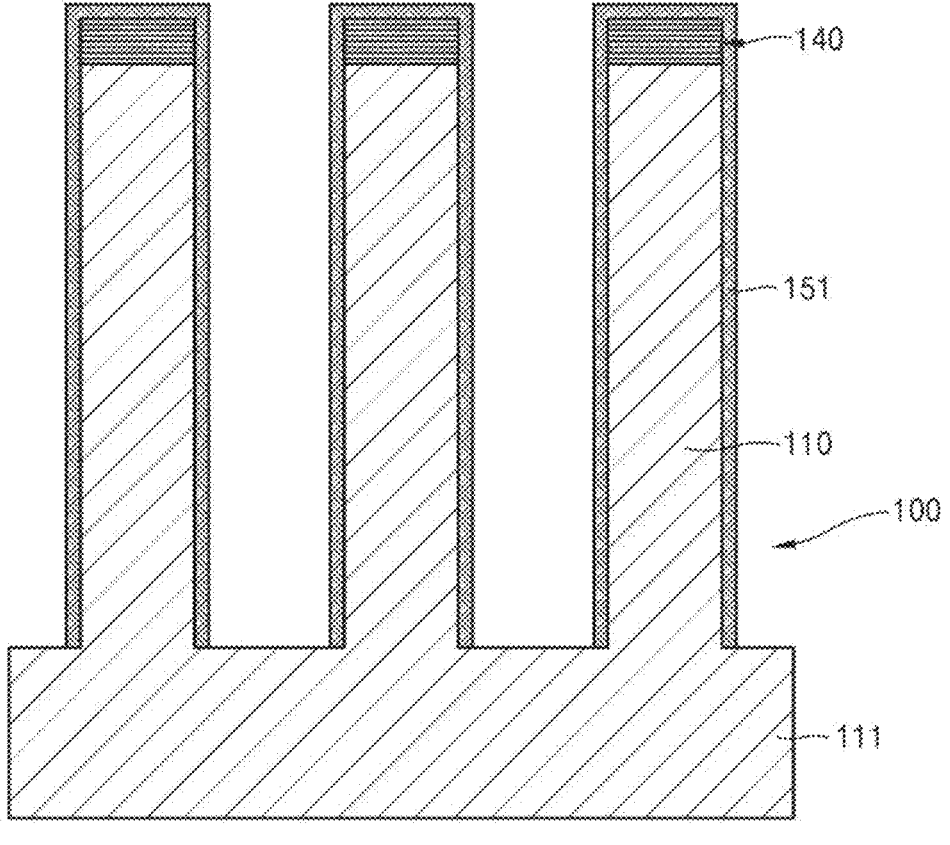

Referring to FIG. 1E, first passivation layers 151 may be formed on the surfaces of the first nitride semiconductor layers 110 and the stress relaxation layers 140, respectively. The first passivation layers 151 may be formed on a side surface of each of the first nitride semiconductor layers 110 and a side surface and an upper surface of each of the stress relaxation layers 140.

The first passivation layers 151 may include an insulating material. For example, the first passivation layers 151 may include a transparent insulating material. The first passivation layers 151 may include, but is not limited to, one or more insulating materials selected from the group consisting of silicon oxide ($SiO_2$), silicon nitride ($Si_3N_4$), aluminum oxide ($Al_2O_3$), and titanium oxide ($TiO_2$), but is not limited thereto, and various materials having insulating properties may be used.

Figure 1F:
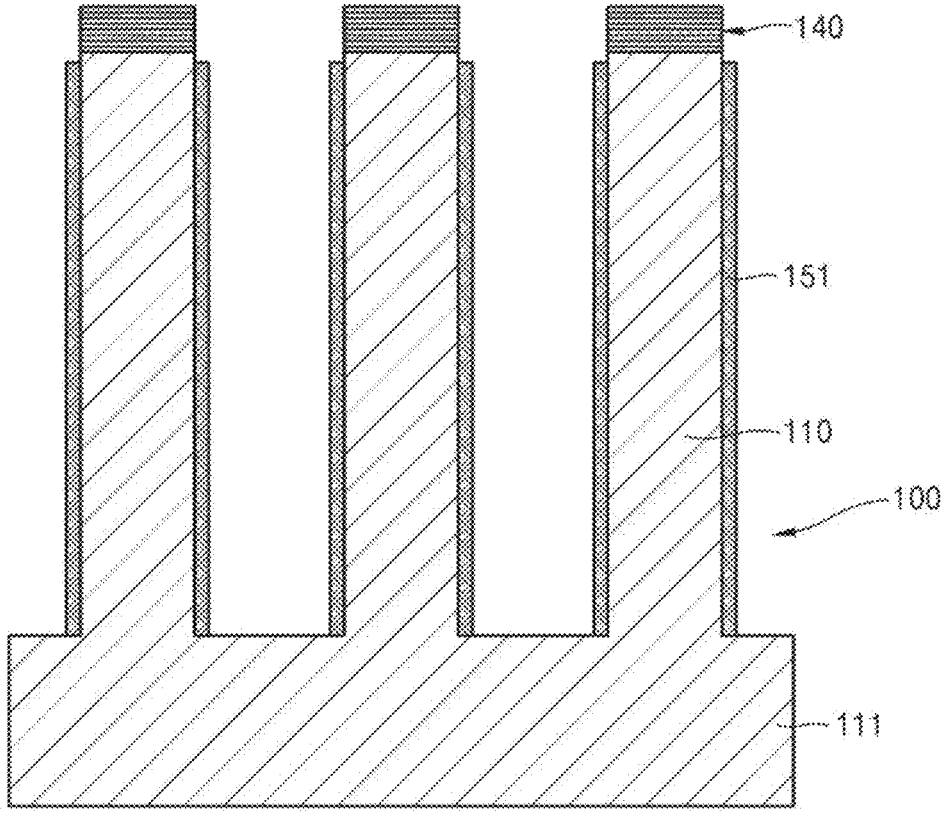

Referring to FIG. 1F, the first passivation layers 151 may be patterned to expose at least a portion of an upper surface and a side surface of the stress relaxation layer 140. A portion of each of the first passivation layers 151 may be removed to expose a side surface of the stress relaxation layer 140. The first passivation layer 151 present on the upper surface and the side surface of each of the stress relaxation layers 140 may be removed.

Each of the remaining first passivation layers 151 surrounds the side surface of each of the first nitride semiconductor layers 110. Each of the first passivation layers 151 may be arranged on a side surface of each of the first nitride semiconductor layers 110. The first passivation layers 151 may protect the first nitride semiconductor layers 110, respectively, and may expose an upper surface and a side surface of each of the stress relaxation layers 140.

Figure 1G:
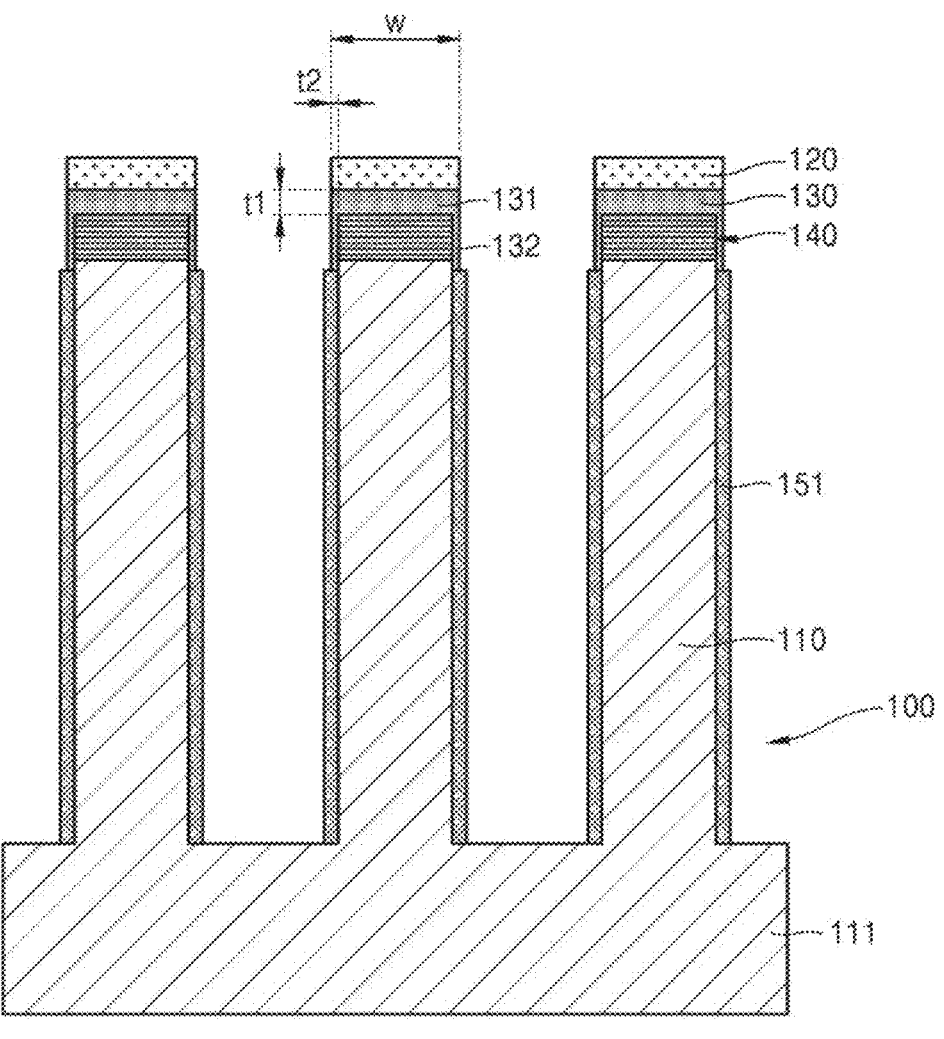
Figure 1H:
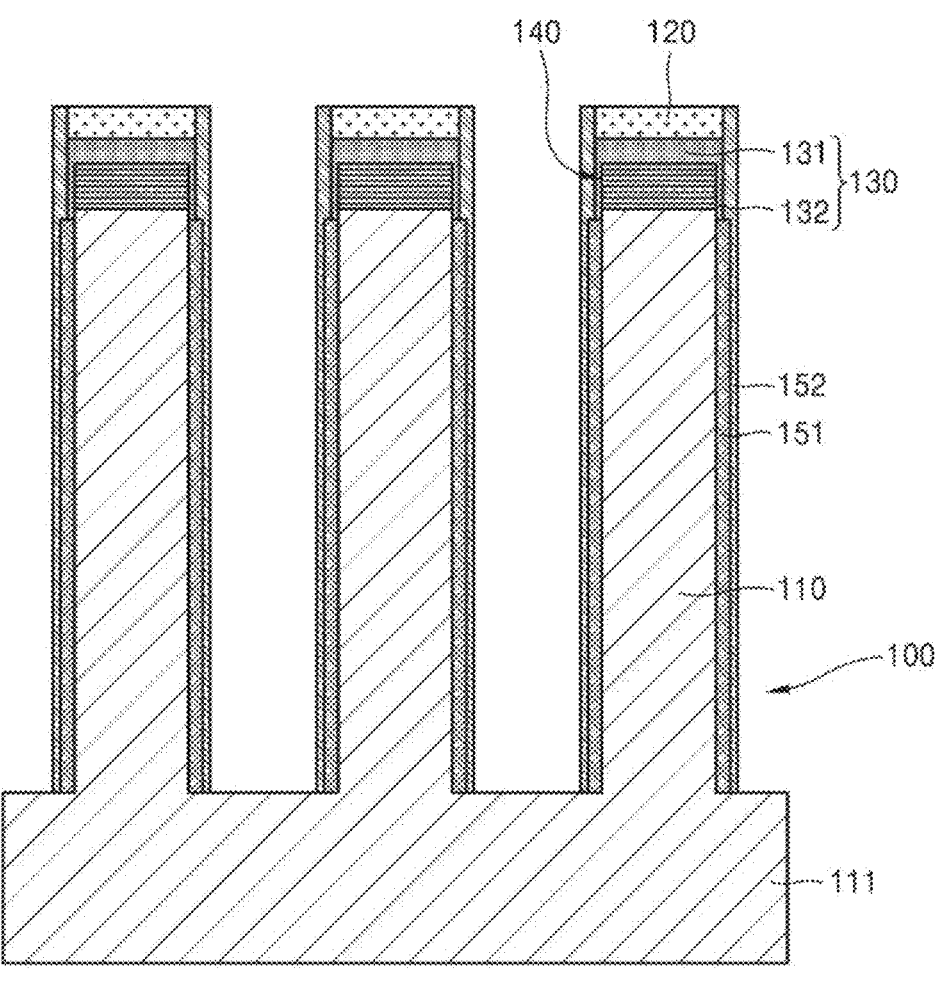

Referring to FIG. 1G, the active layer 130 may be grown on each of the stress relaxation layers 140 exposed to the outside.

The active layer 130 may be grown by a MOCVD method. However, the growth method of the active layer 130 is not limited thereto, and various methods may be used. For example, the active layer 130 may be formed on each of the stress relaxation layers 140 using a method, such as CVD, PECVD, MBE, HYPE, or the like.

The active layer 130 may have a multi-quantum well (MQW) structure or a single-quantum well (SQW) structure.

The active layer 130 may have a structure covering the stress relaxation layer 140 exposed to the outside. The active layer 130 may be a plurality of active layers 130 spaced apart from each other. The active layer 130 may include an upper active region 131 arranged on an upper surface of the stress relaxation layer 140 and a side active region 132 arranged on a side surface of the stress relaxation layer 140. The active layer 130 is grown by deposition, and then an etching process for the active layer 130 is not performed. Accordingly, the active layer 130 may prevent a surface defect caused by an etching process.

The upper active region 131 may be epitaxially grown on the upper surface of the stress relaxation layer 140. Since the stress relaxation layer 140 is in a state in which the stress is relaxed by the etching process, defects due to stress may hardly appear inside the stress relaxation layer 140. In other words, a crystal defect or a dislocation may not be shown (or at least only partially shown) in the stress relaxation layer 140. Thus, the generation of defects in the upper active region 131 epitaxially grown on the upper surface of the stress relaxation layer 140 may be minimized, and light efficiency may be improved.

The side active region 132 may be grown on a side surface of the stress relaxation layer 140. At least a portion of the side active region 132 may contact the side surface of the stress relaxation layer 140. Since the side active region 132 has a different growth direction from the upper active region 131, the side active region 132 may have a different thickness and indium content than the upper active region 131. For example, the thickness t2 of the side active region 132 may be less than the thickness t1 of the upper active region 131. The indium content of the side active region 132 may be smaller than the indium content of the upper active region 131.

The active layer 130 may include a group III-V semiconductor, for example, InGaN, GaN, AlGaN, AlInGaN, and the like. The active layer 130 may include a nitride semiconductor material including indium (In). For example, the active layer 130 may include InGaN.

The wavelength of light emitted may be different according to the material content in the active layer 130. The active layer 130 may include an indium content for emitting light of a long wavelength. The indium content of the active layer 130 may be about 20% or more and about 40% or less. For example, the active layer 130 may emit light having a wavelength greater than or equal to about 500 nm, and may include indium greater than or equal to about 20%. Alternatively, the active layer 130 may emit light having a wavelength of about 620 nm to about 750 nm, and may include indium of about 35% or more. The active layer 130 may emit red light. The indium content of the active layer 130 may be higher than the indium content of the stress relaxation layer 140.

The size of the active layer 130 may be micrometers or nanometers. The width w of the active layer 130 may be micrometers or nanometers. The width w of the active layer 130 may correspond to the width w of the light emitting device 100. For example, the width w of the active layer 130 may be about 100 μm or less. For example, the width w of the active layer 130 may be about 20 μm or less. For example, the width w of the active layer 130 may be about 10 μm or less. The width w of the active layer 130 may be about 1 μm or less. The width w of the active layer 130 may be about 0.1 μm or more. The width w of the active layer 130 may refer to a width w of each of the plurality of active layers 130 when there are a plurality of active layers 130 as shown in FIG. 1G, and may refer to a width W of the single active layer 130 when the active layer 130 is a single layer.

The width w of the active layer 130 may be greater than the width of the stress relaxation layer 140. A difference between the width w of the active layer 130 and the width of the stress relaxation layer 140 may correspond to the thickness t2 of the side active region 132.

In the light emitting device 100 having a predetermined size or more, the material and the content of the active layer 130 may be determined in consideration of the wavelength of the required light.

Figure 3:
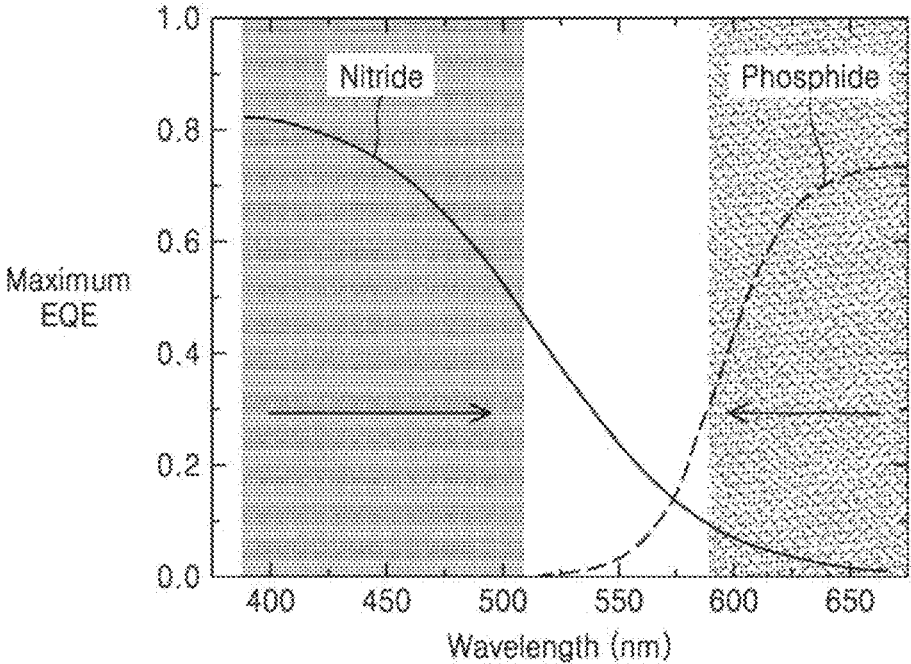
FIG. 3 is a graph showing light efficiency of a light emitting device according to a material of an active layer for each wavelength.

FIG. 3 is a graph showing light efficiency of a light emitting device 100 according to a material of an active layer 130 for each wavelength according to an embodiment. Referring to FIG. 3, it may be confirmed that, when the size of the light emitting device 100 is 100 μm or more, the maximum value of external quantum efficiency (EQE) decreases as the wavelength of the light emitting device 100 including a nitride semiconductor material increases, but the wavelength of the light emitting device 100 including a phosphide semiconductor material has a high maximum value of EQE in a region with a long wavelength.

The active layer 130 including a nitride-based semiconductor material should increase the indium content in order to lengthen the wavelength of the extracted light. However, as the content of indium included in the active layer 130 increases, the lattice constant increases, and thus, a crystal defect may increase during a growth process due to a difference in lattice constants between the first nitride semiconductor layer 110 and the active layer 130. Thus, the light emitting device 100 using a nitride semiconductor material has good light efficiency with respect to a short wavelength, but the light efficiency with respect to a long wavelength is degraded.

Accordingly, it may be difficult to use a nitride semiconductor material in the light emitting device 100 for generating light having a long wavelength, and thus it may be considered that another semiconductor material, for example, a phosphide semiconductor material, is used. However, the light emitting device 100 using a phosphide semiconductor material may be vulnerable to miniaturization. In other words, when the light emitting device 100 using the phosphide semiconductor material is miniaturized, light efficiency may be rapidly reduced.

When the light emitting device 100 is miniaturized, the surface recombination velocity of the corresponding material affects the light efficiency of the light emitting device 100. As the surface recombination velocity increases, the light efficiency decreases.

Figure 4:
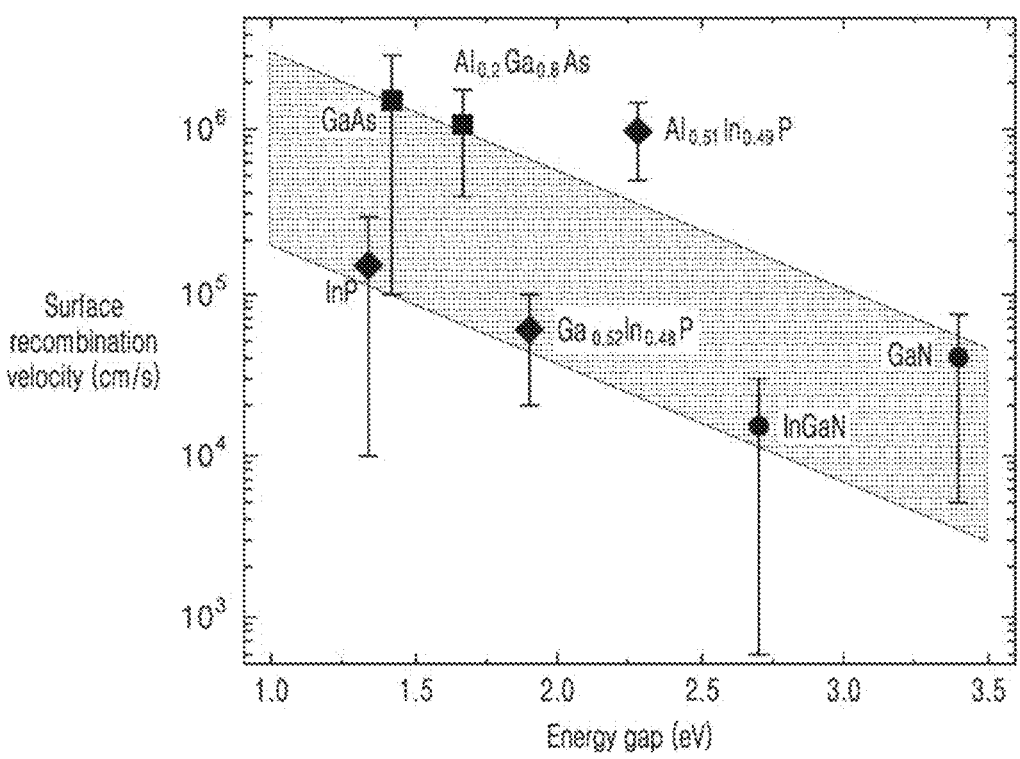
FIG. 4 is a graph showing energy bandgap and surface recombination velocity according to the material of the active layer.

FIG. 4 is a graph showing energy bandgap and surface recombination velocity according to the material of the active layer 130. Referring to FIG. 4, it may be seen that the surface recombination velocity of the semiconductor materials including phosphorus (P) is much larger than the surface recombination velocity of the semiconductor materials including the nitride (N). As such, the phosphide semiconductor material has a higher surface recombination velocity than the nitride semiconductor material, and accordingly, the light efficiency may decrease rapidly as the light emitting device 100 becomes smaller.

Figure 5A:
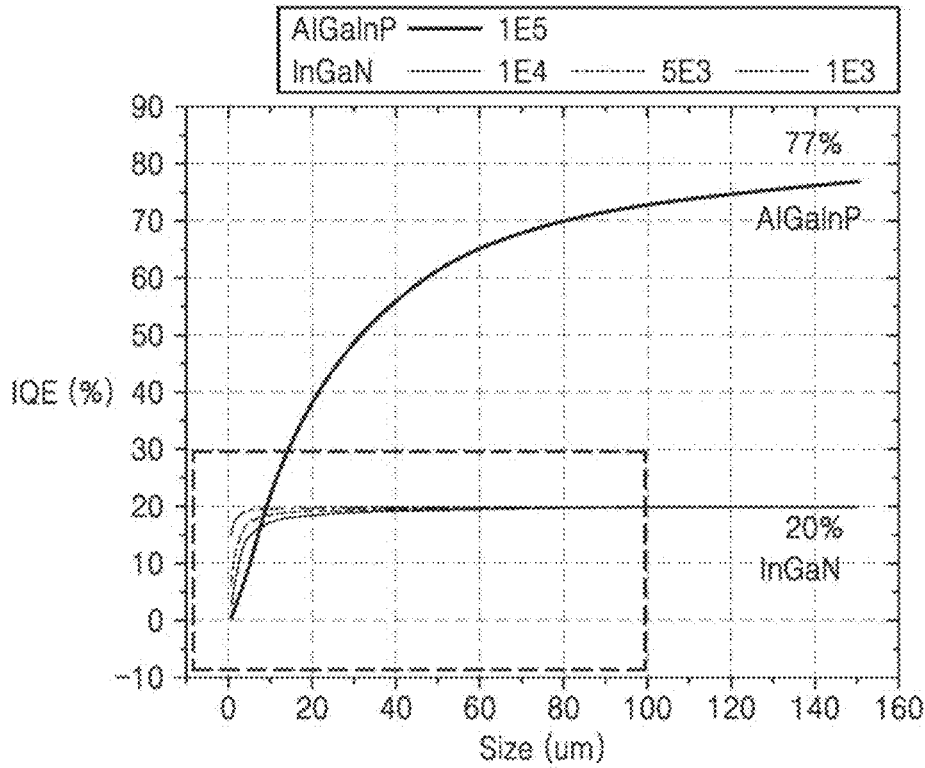
FIG. 5A is a graph illustrating a relationship between a size of an active layer and light efficiency for each material of the active layer.
Figure 5B:
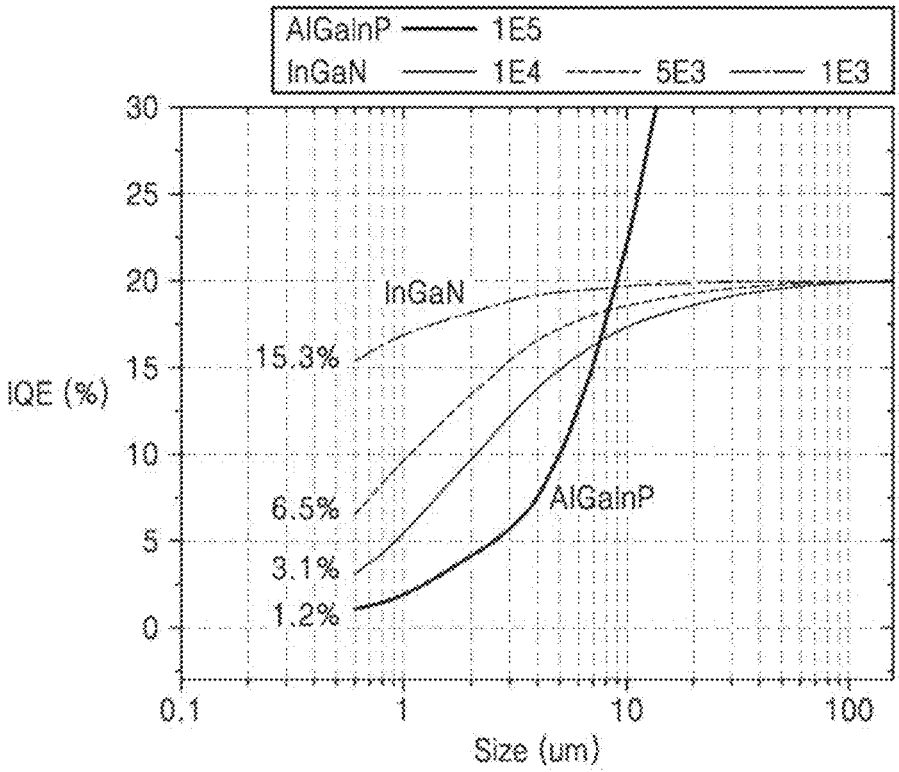
FIG. 5B is a graph illustrating a portion of FIG. 5A as a log scale.

FIG. 5A is a graph illustrating a relationship between a size of an active layer 130 and light efficiency for each material of the active layer 130 FIG. 5B is a graph illustrating a portion (dashed boxes) of FIG. 5A as a log scale. In FIGS. 5A and 5B, the material of the active layer 130 exhibits a relationship between the size of the active layer 130 and the internal quantum efficiency (IQE) when the material of the active layer 130 is AlGaInP of $1 \times 10^5$ cm/s, InGaN of $1 \times 10^4$ cm/s, InGaN of $5 \times 10^3$ cm/s, or InGaN of $1 \times 10^3$ cm/s, in terms of a surface recombination velocity.

Referring to FIG. 5A, when the size of the active layer 130 of the light emitting device capable of emitting red light of 630 nm or more is 100 μm or more, the IQE of the active layer 130 including AlGaInP is 70% or more, but the IQE of the active layer 130 including InGaN is estimated to be less than 20% even considering the theoretical limit efficiency. However, it may be seen that as the size of the active layer 130 containing AlGaInP decreases, the internal quantum efficiency decreases.

Referring to FIGS. 5A and 5B, as the size of the active layer 130 including phosphorus (P) decreases, it may be seen the IQE is rapidly reduced. When the size of the active layer 130 is 10 μm or less, the IQE of the active layer 130 including phosphorus (P) is smaller than the IQE of the active layer 130 including nitride (N). In other words, it may be seen that the IQE of the active layer 130 including the nitride (N) is greater than the IQE of the active layer 130 including phosphorus. Accordingly, when the active layer 130 or the light emitting device 100 is miniaturized, it may be seen that the use of a phosphide semiconductor material as a material of the active layer 130 is difficult. In other words, in a light emitting device 100 of a predetermined size, for example, 100 μm or less, the light efficiency of the phosphide semiconductor material may decrease rapidly as the light emitting device 100 is miniaturized, and the nitride semiconductor material may cause the crystal quality of the active layer 130 to decrease according to the indium content for long wavelength.

However, in the light emitting device 100 according to the embodiment, the active layer 130 includes a nitride semiconductor material, and is grown on the stress relaxation layer 140 in which the stress is relieved, thereby mitigating lattice mismatch and improving the crystal quality of the active layer 130 for a long wavelength. In addition, since the active layer 130 includes a nitride semiconductor material rather than a phosphide semiconductor material, a decrease in light efficiency due to the miniaturization of the light emitting device 100 may be reduced.

Referring back to FIG. 1G, the active layer 130 may be individually arranged on a plurality of stress relaxation layers 140 spaced apart from each other. The plurality of active layers 130 may be spaced apart from each other. In other words, the side active region 132 of the active layer 130 may be spaced apart from the side active region 132 of the adjacent active layer 130.

Next, a second nitride semiconductor layer 120 may be formed on the active layer 130. The second nitride semiconductor layer 120 may be grown on the upper surface of the active layer 130.

The second nitride semiconductor layer 120 may include a group III-V-based p-type semiconductor, for example, p-GaN. The second nitride semiconductor layer 120 may have a single-layer or multi-layer structure. For example, the second nitride semiconductor layer 120 may be a semiconductor layer that includes a semiconductor material of any one of InAlGaN, GaN, AlGaN, InGaN, AlN, and InN, and is doped with a conductive dopant, such as Mg.

The second nitride semiconductor layer 120 may be formed using a method, such as a MOCVD method, a CVD method, a PECVD method, a MBE method, a HVPE method, or the like.

The second nitride semiconductor layer 120 may be arranged on the upper active region 131 of the active layer 130. However, the arrangement of the second nitride semiconductor layer 120 is not limited thereto. For example, the second nitride semiconductor layer 120 may be arranged on the upper active region 131 and the side active region 132 of the active layer 130.

Figure 6:
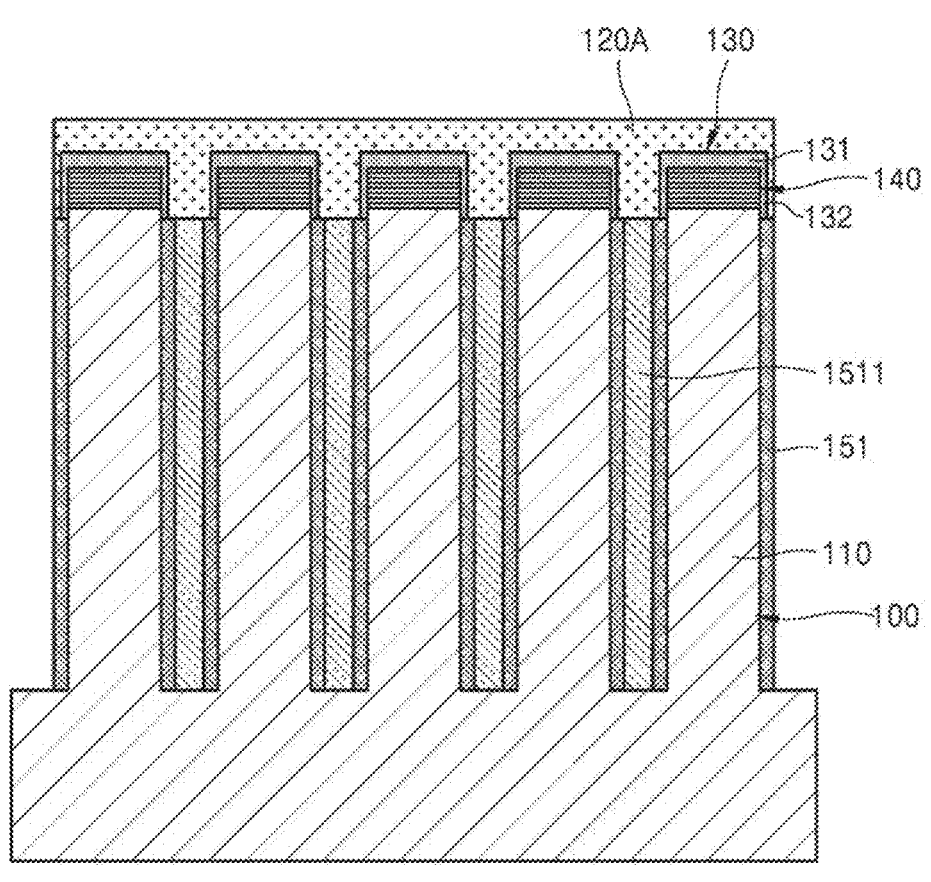
FIG. 6 is a cross-sectional view illustrating an active layer of a light emitting device according to an embodiment.

FIG. 6 is a cross-sectional view illustrating an active layer of a light emitting device according to an embodiment. Although the plurality of active layers 130 and the plurality of second nitride semiconductor layers 120 are spaced apart from each other in the above-described embodiment, the shapes and arrangements of the active layer 130 and the second nitride semiconductor layer 120 are not limited thereto and may vary. For example, as shown in FIG. 6, a plurality of active layers 130 may be formed on the plurality of stress relaxation layers 140, and the second nitride semiconductor layer 120A may be formed on the plurality of active layers 130. The plurality of active layers 130 on each of the plurality of active layers 130 may connect each other. An insulating material 1511 may be filled between the first passivation layers 151. The plurality of active layers 130 may be connected to the second nitride semiconductor layer 120A to form one light emitting device 100.

Referring back to FIG. 1H, a second passivation layer 152 may be formed to protect side surfaces of the second nitride semiconductor layer 120 and the active layer 130. The second passivation layer 152 may contact the side surface of the active layer 130 and may contact the side surface of the second nitride semiconductor layer 120. The second passivation layer 152 may extend to contact the side surface of the first passivation layer 151.

The material of the second passivation layer 152 may include an insulating material. The material of the second passivation layer 152 may include a transparent insulating material. For example, the second passivation layers 152 may include, but is not limited to, one or more insulating materials selected from the group consisting of silicon oxide (SiO$_2$), silicon nitride (Si$_3$N$_4$), aluminum oxide (Al$_2$O$_3$), and titanium oxide (TiO$_2$), but is not limited thereto, and various materials having insulating properties may be used. The material of the second passivation layer 152 may be the same as the material of the first passivation layer 151.

The light emitting device 100 according to the manufacturing method may include a plurality of light emitting devices 100. Each of the plurality of light emitting devices 100 includes the first nitride semiconductor layer 110 having a bar shape, the stress relaxation layer 140, the active layer 130 arranged on an upper surface and a side surface of the stress relaxation layer 140, and the second nitride semiconductor layer 120.

The plurality of light emitting devices 100 may be individually separated. The individually separated light emitting device 100 may be treated as one light emitting device 100.

Each of the light emitting devices 100 may have a micro or nano-scale size. For example, the width, diameter, or thickness of the light emitting device 100 may be about 100 μm or less, or about 50 μm or less. The light emitting device 100 may have a bar shape having a width smaller than a length thereof. For example, the light emitting device 100 may have a width in a range of about 0.3 μm to about 1 μm, and a ratio of a length to a width may be about three times or more. A length of the light emitting device 100 may be in a range of about 1 μm to about 5 μm. The light emitting device 100 may include a light emitting diode (LED), a vertical-cavity surface-emitting laser (VCSEL), etc.

However, the light emitting device 100 according to the manufacturing method is not necessarily limited to the plurality of light emitting devices 100 being used separately. For example, the plurality of light emitting devices 100 may be used in a state before being separated from each other, that is, in a state connected to each other. The light emitting device 100 may include the plurality of first nitride semiconductor layers 110, the plurality of stress relaxation layers 140, the plurality of active layers 130, and the plurality of second nitride semiconductor layers 120, and may emit light in each of the plurality of active layers 130.

Figure 7A:
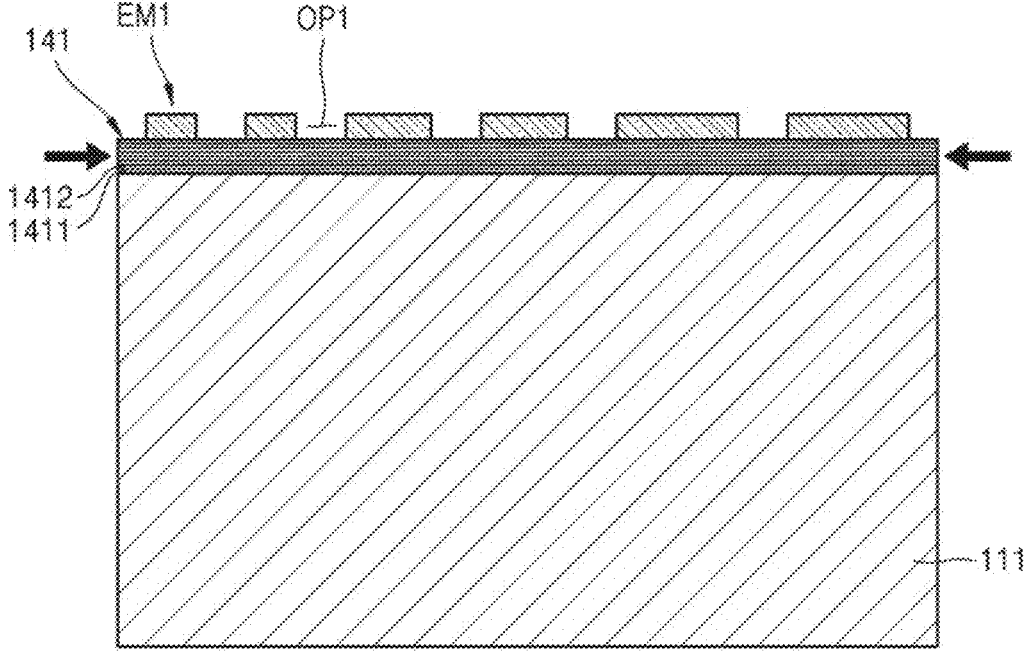
FIGS. 7A, 7B, 7C and 7D are diagrams illustrating a portion of a method of manufacturing a light emitting device according to an embodiment.

FIGS. 7A, 7B, 7C and 7D are diagrams illustrating a portion of a method of manufacturing a light emitting device 100 according to an embodiment. For convenience, the growth process of the stress base layer 141, which is the previous process of FIG. 7A, is the same as that of FIGS. 1A and 1B, and thus a description thereof will be omitted.

Figure 7B:
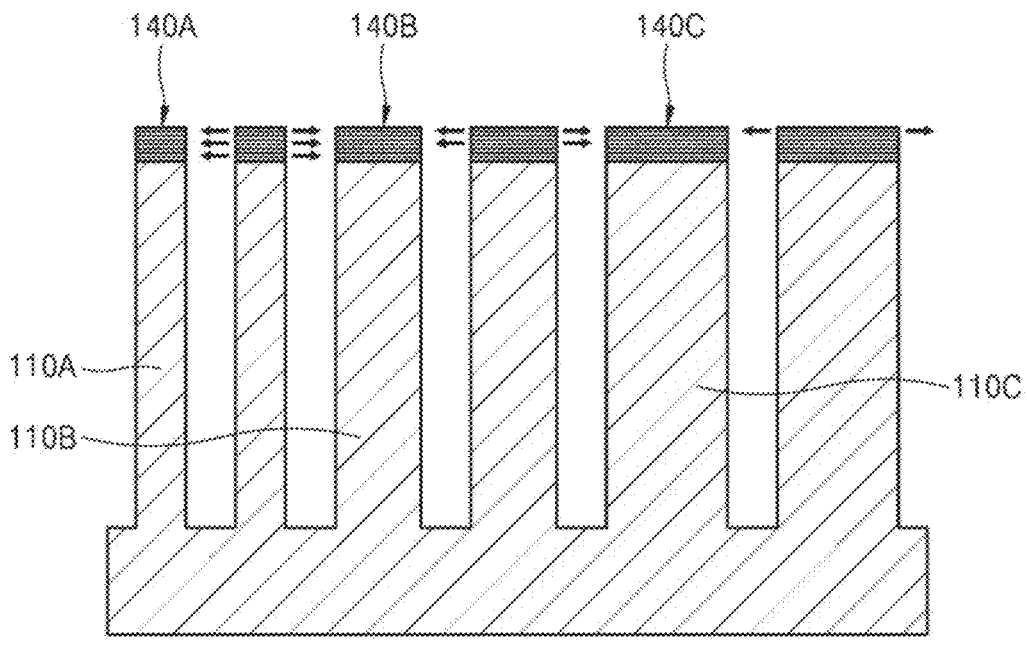

Referring to FIGS. 7A and 7B, an etching mask EM1 is arranged on the stress base layer 141, and the stress base layer 141 and the first nitride semiconductor base layer 111 under the opening OP1 of the etching mask EM are sequentially removed. Accordingly, a plurality of stress relaxation layers 140A, 140B, and 140C at least a portion of which has different widths of are formed.

The stress relaxation layers 140A, 140B, and 140C having different widths may have different degrees of stress relaxation during an etching process. Accordingly, the wavelengths of the light emitted from the active layers 130A, 130B, and 130C that are grown in the stress relaxation layers 140A, 140B, and 140C may be different from each other.

Figure 7C:
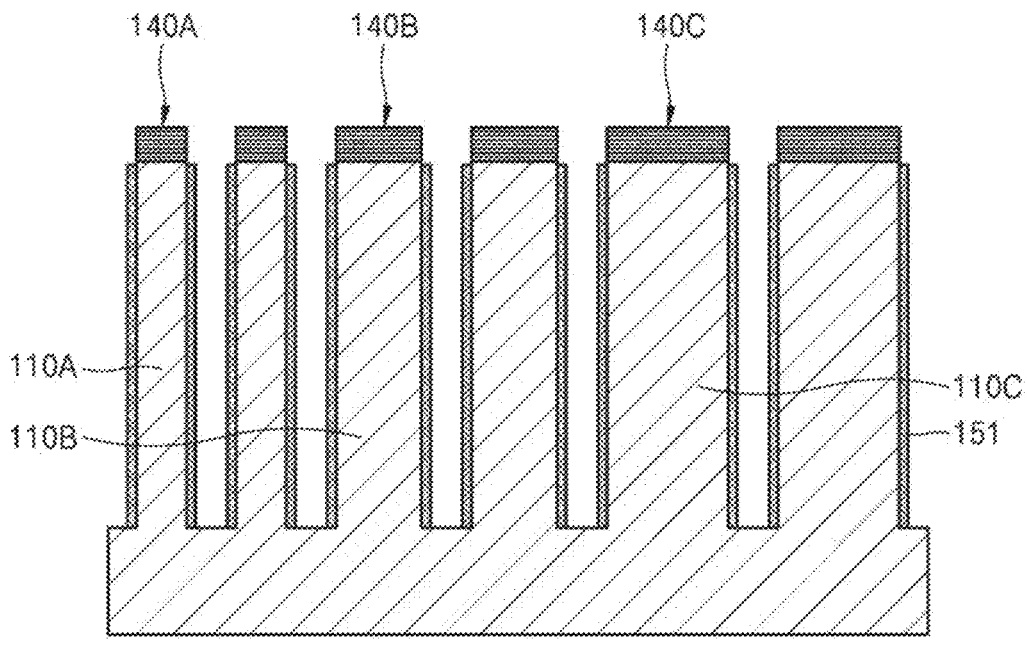
Figure 7D:
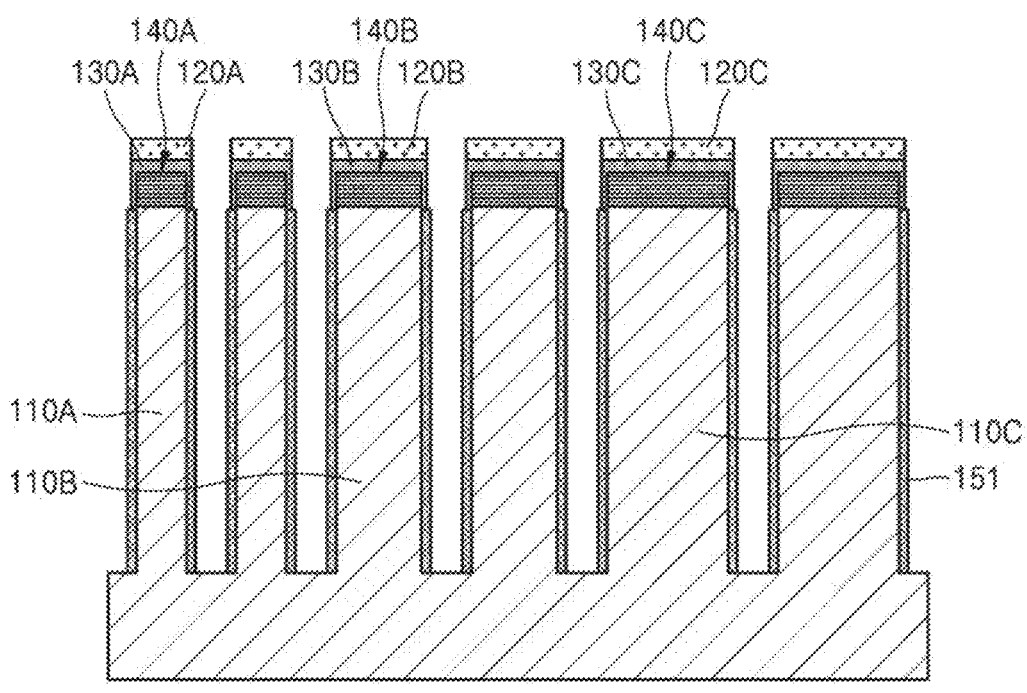

Referring to FIGS. 7C and 7D, the first passivation layer 151 is arranged to cover side surfaces of the first nitride semiconductor layers 110A, 110B, and 110C, and the active layers 130A, 130B, and 130C are formed on the stress relaxation layers 140A, 140B, and 140C. The active layers 130A, 130B, and 130C may be grown to cover upper and side surfaces of the plurality of stress relaxation layers 140A, 140B, and 140C.

The active layers 130A, 130B, and 130C may be grown on the plurality of stress relaxation layers 140A, 140B, and 140C in different orders. However, the growth of the active layers 130A, 130B, and 130C is not limited thereto, and the active layers 130A, 130B, and 130C may be simultaneously grown on the plurality of stress relaxation layers 140A, 140B, and 140C. In the subsequent step, the second nitride semiconductor layers 120A, 120B, and 120C are grown on the active layers 130A, 130B, and 130C.

In the light emitting device 100 according to an embodiment, light emitted from a plurality of active layers 130A, 130B, and 130C may be different. For example, some active layers 130A emit red light, some active layers 130B emit green light, and some active layers 130C emit blue light.

Figure 8A:
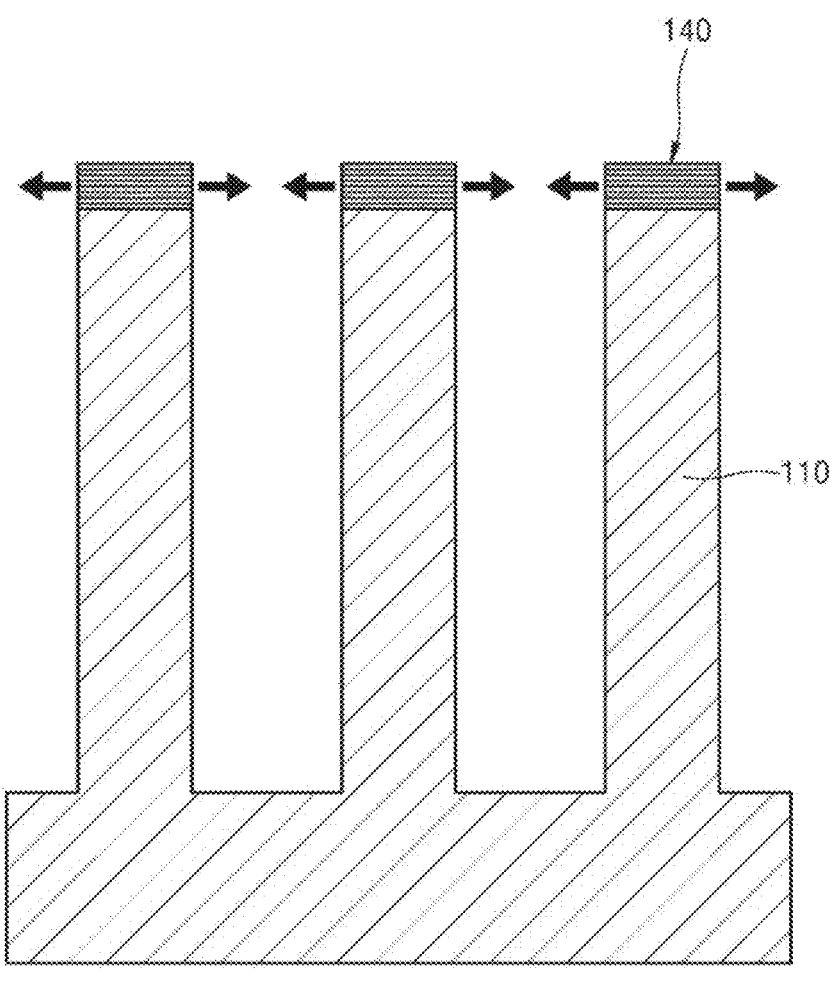
FIGS. 8A, 8B and 8C are diagrams illustrating a portion of a method of manufacturing a light emitting device according to an embodiment.
Figure 8B:
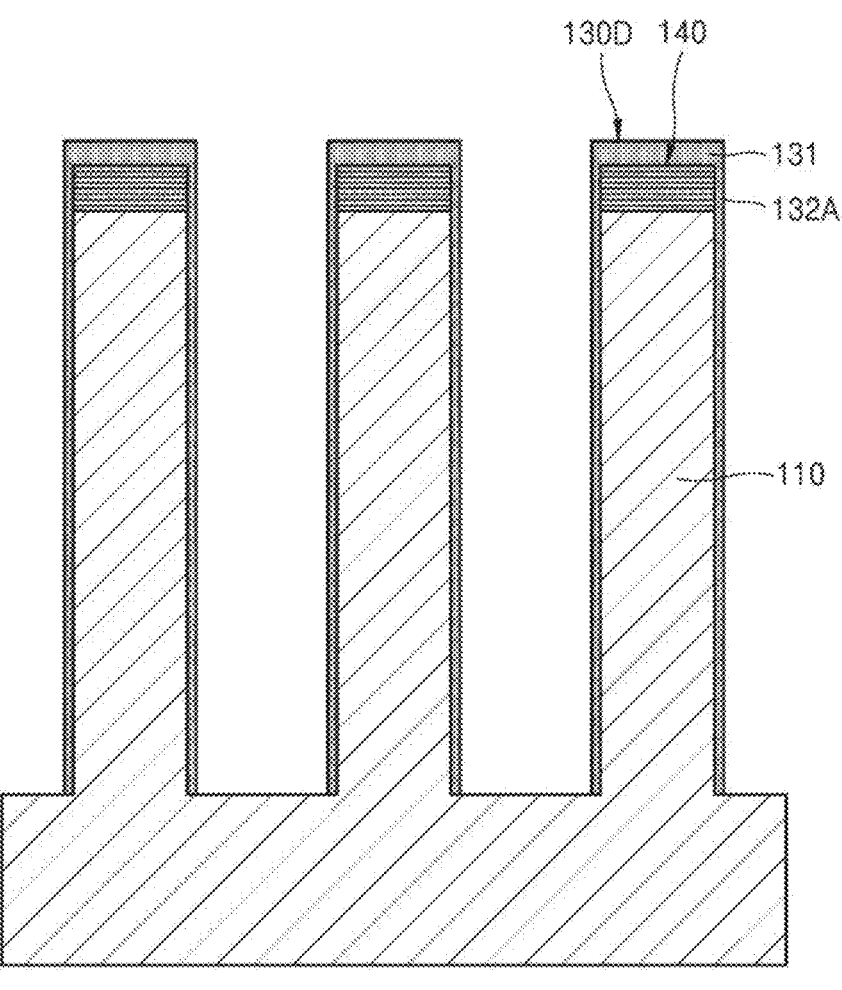
Figure 8C:
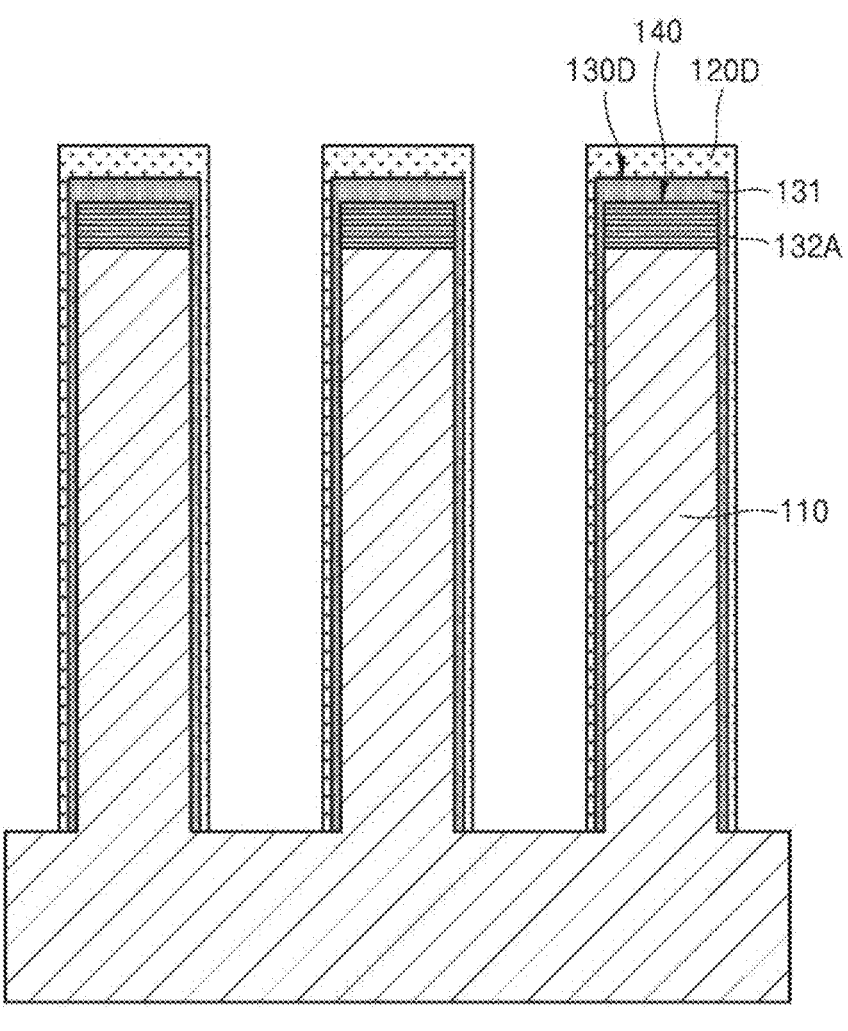

FIGS. 8A, 8B and 8C are diagrams illustrating a portion of a method of manufacturing a light emitting device 100 according to an embodiment. Referring to FIGS. 8A to 8C, after the stress relaxation layer 140 is formed, the active layer 130D may be formed without the first passivation layer 151. The active layer 130D may be arranged to cover an upper surface and a side surface of the stress relaxation layer 140 and a side surface of the first nitride semiconductor layer 110. The side active region 132A may include a first side active region arranged on the side of the stress relaxation layer 140 and a second side active region extending from the first side active region and arranged on the side of the first nitride semiconductor layer 110. A second nitride semiconductor layer 120D may be formed on the active layer 130D. For example, the second nitride semiconductor layer 120D may be arranged to cover not only the upper region of the active layer 130D but also the side region of the active layer 130D. The second nitride semiconductor layer 120D may include an upper nitride semiconductor region arranged on the upper active region 131 and a side nitride semiconductor region arranged on the side active region 132A to surround the active layer 130D.

Figure 9:
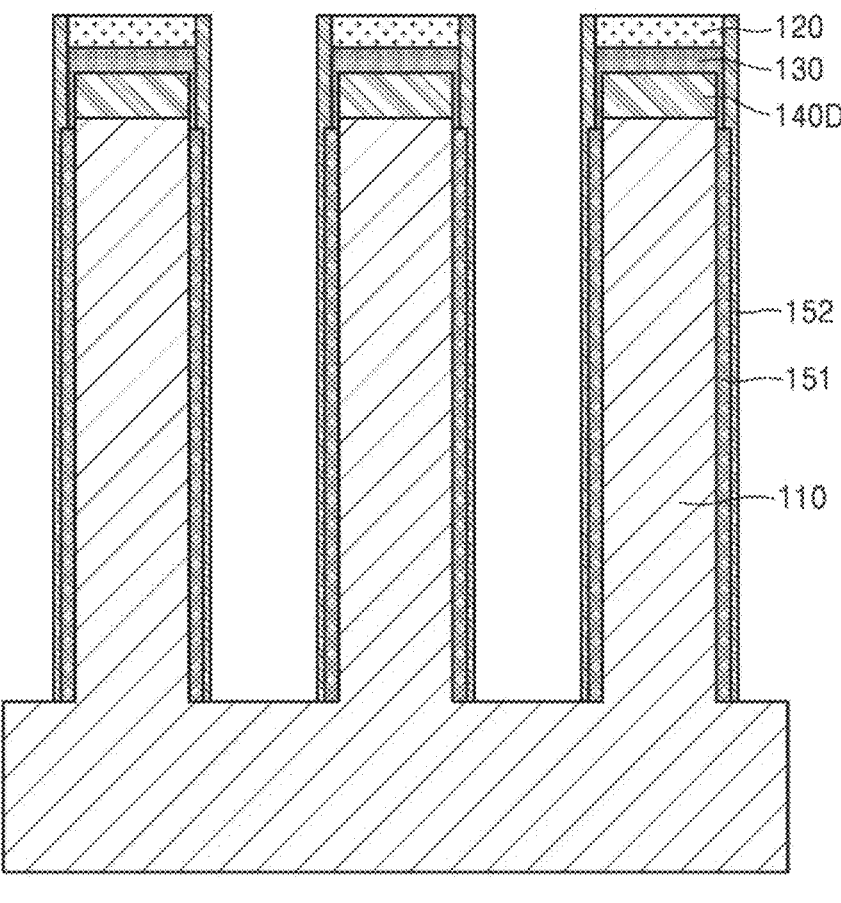
FIG. 9 is a cross-sectional view illustrating a stress relaxation layer of a light emitting device according to an embodiment.

FIG. 9 is a cross-sectional view illustrating a stress relaxation layer of a light emitting device according to an embodiment. In the above-described embodiment, the stress relaxation layer 140 has been mainly described as an example in which the stress relaxation layer 140 has a multilayer structure. However, the stress relaxation layer 140 does not necessarily have a multi-layered structure and may have a single-layer structure. For example, as shown in FIG. 9, the stress relaxation layer 140D of the light emitting device 100 may have a single-layer structure. The stress relaxation layer 140D may have a bulk structure rather than a superlattice structure. The thickness of the stress relaxation layer 140D may be less than or equal to a critical thickness. The stress relaxation layer 140D having a single layer structure may include InGaN. For example, the stress relaxation layer 140D may be a single layer having an indium content of 20% or less and a thickness of 10 nm or less.

Figure 10:
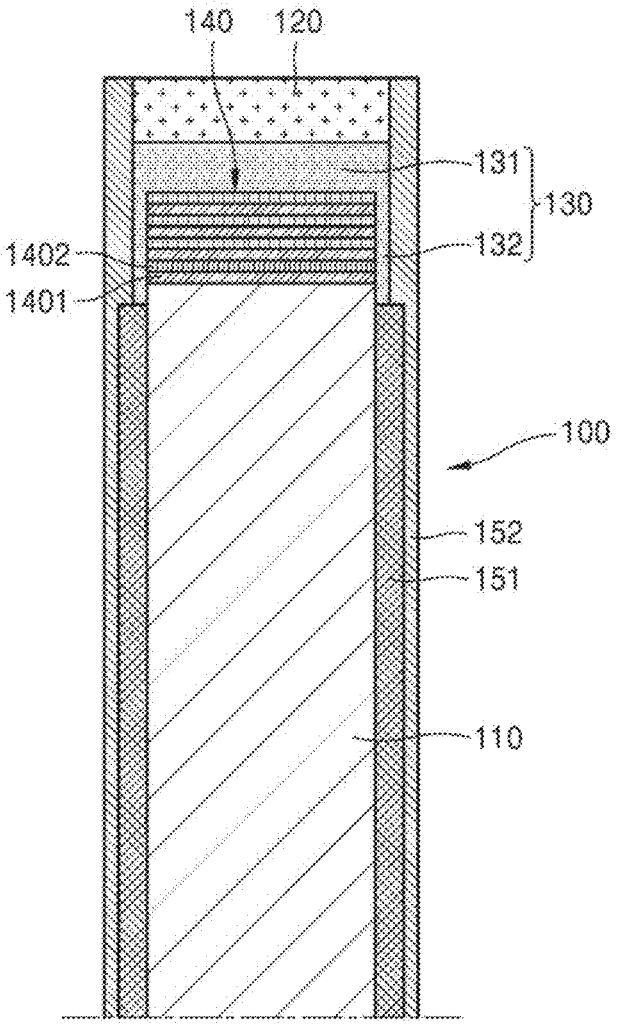
FIG. 10 is a cross-sectional view of a light emitting device according to an embodiment.

FIG. 10 is a cross-sectional view of a light emitting device 100 according to an embodiment. FIGS. 11 to 14 are cross-sectional views of a light emitting device 100 according to an embodiment.

Referring to FIG. 10, the light emitting device 100 according to the embodiment may include various types of light emitting devices 100 having a size of micro or nano scale. For example, the width, diameter, or thickness of the light emitting device 100 may be about 100 μm or less, or about 50 μm or less. For example, the width, diameter, or thickness of the light emitting device 100 may be about 10 μm or less. The light emitting device 100 may have a bar shape having a width smaller than a length thereof. For example, the light emitting device 100 may have a width in a range of about 0.3 μm to about 1 μm, and a ratio of a length to a width may be about three times or more. A length of the light emitting device 100 may be in a range of about 1 μm to about 5 μm. The light emitting device 100 may include an LED, a VCSEL, etc.

The light emitting device 100 may include first and second nitride semiconductor layers 110 and 120 spaced apart from each other and an active layer 130 arranged between the first and second nitride semiconductor layers 110 and 120 to emit light.

The first nitride semiconductor layer 110 may be a semiconductor layer doped with a first conductive type. For example, the first nitride semiconductor layer 110 may be a nitride semiconductor layer doped with an n-type dopant. For example, the first nitride semiconductor layer 110 may include n-GaN. The material of the first nitride semiconductor layer 110 is not necessarily limited thereto, and in some cases, the first nitride semiconductor layer 110 may include a p-type semiconductor.

The first nitride semiconductor layer 110 may have a single-layer or multi-layer structure. The first nitride semiconductor layer 110 may include a semiconductor layer that includes, for example, InAlGaN, GaN, AlGaN, and/or InGaN, and is doped with a conductive type, such as Si, Ge, Sn, etc. The first nitride semiconductor layer 110 may have a first lattice constant.

The active layer 130 may be arranged on the first nitride semiconductor layer 110. The active layer 130 may be arranged between the first and second nitride semiconductor layers 110 and 120.

The active layer 130 may generate light while electrons and holes are combined with each other. The active layer 130 may have a MQW structure or a SQW structure.

The active layer 130 may include a nitride semiconductor material including indium (In). For example, the active layer 130 may include a group III-V based semiconductor, for example, InGaN, AlInGaN, and the like. A clad layer doped with a conductive dopant may be formed on an upper portion and/or a lower portion of the active layer 130. As an example, the clad layer may be implemented as an AlGaN layer or an InAlGaN layer.

The active layer 130 may have a lattice constant greater than the first nitride semiconductor layer 110.

The second nitride semiconductor layer 120 may be a semiconductor layer doped with a second conductive type different from the first conductive type. For example, the second nitride semiconductor layer 120 may be a nitride semiconductor layer doped with a p-type dopant. The second nitride semiconductor layer 120 may include a group III-V-based p-type semiconductor, for example, p-GaN.

The second nitride semiconductor layer 120 may be arranged on the active layer 130. The second nitride semiconductor layer 120 may have a single-layer or multi-layer structure. For example, the second nitride semiconductor layer 120 may be a semiconductor layer that includes a semiconductor material of any one of InAlGaN, GaN, AlGaN, InGaN, AlN, and InN, and is doped with a conductive dopant, such as Mg.

In addition to the above-described first nitride semiconductor layer 110, active layer 130, and second nitride semiconductor layer 120, the light emitting device 100 may further include another clad layer and/or electrode on upper and/or lower portions of each layer.

The stress relaxation layer 140 may be arranged between the first nitride semiconductor layer 110 and the active layer 130. The stress relaxation layer 140 may function as a buffer layer for growing the active layer 130 having a lattice constant larger than the first nitride semiconductor layer 110 on the first nitride semiconductor layer 110. The stress relaxation layer 140 may have a lattice constant between the first lattice constant and the second lattice constant.

For example, the stress relaxation layer 140 may include a nitride semiconductor material including indium. The material of the stress relaxation layer 140 may be determined in consideration of the material of the active layer 130. For example, when the material of the active layer 130 includes InGaN, the material of the stress relaxation layer 140 may include InGaN. The indium content of the stress relaxation layer 140 may be less than the indium content of the active layer 130. For example, when the indium content of the active layer 130 is about 34%, the indium content of the stress relaxation layer 140 may be about 20%.

The material of the stress relaxation layer 140 may be different from the material of the first nitride semiconductor layer 110. For example, when the first nitride semiconductor layer 110 includes n-GaN, the stress relaxation layer 140 may include InGaN.

The stress relaxation layer 140 may be in a state in which stress is relieved by an etching process. The stress may be relaxed in the upper region of the stress relaxation layer 140 by an etching process. In the stress relaxation layer 140, a lattice constant of a region facing the active layer 130 may be different from a lattice constant of a region facing the first nitride semiconductor layer 110. In the stress relaxation layer 140, a lattice constant of a region facing the active layer 130 may be greater than a lattice constant of a region facing the first nitride semiconductor layer 110.

In the stress relaxation layer 140, the difference between the lattice constant of the region facing the active layer 130 and the lattice constant of the region facing the first nitride semiconductor layer 110 may be about 1% or more of the lattice constant of the first nitride semiconductor layer 110. In the stress relaxation layer 140, the difference between the lattice constant of the region facing the active layer 130 and the lattice constant of the region facing the first nitride semiconductor layer 110 may be about 2% or more of the lattice constant of the first nitride semiconductor layer 110. For example, when the lattice constant of the region facing the active layer 130 in the stress relaxation layer 140 is 3.26, the lattice constant of the region facing the first nitride semiconductor layer 110 is 3.19, and the lattice constant of the active layer 130 is 3.26, the difference between the lattice constants is 0.07 (=3.26-3.19), which is about 2.2% of 3.19 which is the lattice constant of the first nitride semiconductor layer. In the stress relaxation layer 140, the difference between the lattice constant of the region facing the active layer 130 and the lattice constant of the region facing the first nitride semiconductor layer 110 may be about 5% or less of the lattice constant of the first nitride semiconductor layer 110.

The lattice constant of the region facing the first nitride semiconductor layer 110 may correspond to the first lattice constant of the first nitride semiconductor layer 110. For example, the lattice constant of the region facing the first nitride semiconductor layer 110 may be equal to the first lattice constant of the first nitride semiconductor layer 110, or the difference may be less than about 2% of the first lattice constant.

The lattice constant of the region facing the active layer 130 in the stress relaxation layer 140 may be similar to the lattice constant of the active layer 130. For example, the lattice constant of the region facing the active layer 130 in the stress relaxation layer 140 is smaller than the lattice constant of the active layer 130, and the difference may be less than about 2% of the lattice constant of the active layer 130.

The stress relaxation layer 140 may have a multilayer structure. For example, the stress relaxation layer 140 may be a superlattice layer including two or more thin film layers 1401 and 1402. Each of the thin film layers 1401 and 1402 may be selected at a critical thickness or less. For example, the thickness of each of the thin film layers 1401 and 1402 may be about 10 nm or less. Each of the thin film layers 1401 and 1402 may be a layer which is two-dimensionally epitaxially grown.

Figure 11:
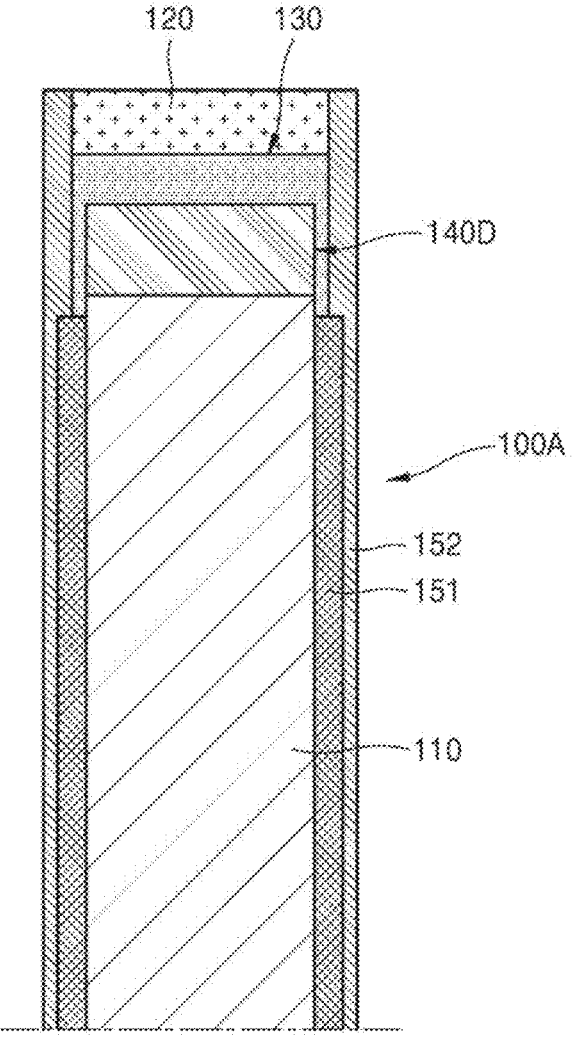
FIGS. 11, 12, 13 and 14 are cross-sectional views of a light emitting device according to an embodiment.

However, the structure of the stress relaxation layer 140 is not limited thereto, and may have a single-layer structure. For example, as shown in FIG. 11, the stress relaxation layer 140D may have a single-layer structure. The stress relaxation layer 140D may have a bulk structure rather than a superlattice structure. The thickness of the stress relaxation layer 140D may be less than or equal to a critical thickness. The stress relaxation layer 140D having a single layer structure may include InGaN. For example, the stress relaxation layer 140D may have an indium content of about 20% or less and a thickness of about 10 nm or less.

The stress relaxation layer 140 may include a nitride semiconductor material including indium. For example, the stress relaxation layer 140 may include a semiconductor material any one of InAlGaN, InGaN, and InN. For example, the stress relaxation layer 140 may include InGaN.

The indium content of the stress relaxation layer 140 may be less than about 35%. For example, the indium content of the stress relaxation layer 140 may be about 20% or less. An indium content of each of the plurality of thin film layers 1401 and 1402 may be 20% or less. For example, the stress relaxation layer 140 may include $In_xGa_{(1-x)}N$ ($0.05 \leq x < 0.30$). For example, the stress relaxation layer 140 may include $In_xGa_{(1-x)}N$ ($0.05 \leq x \leq 0.20$).

The active layer 130 may have a structure covering the stress relaxation layer 140. The active layer 130 may include an upper active region 131 arranged on an upper surface of the stress relaxation layer 140 and a side active region 132 arranged on a side surface of the stress relaxation layer 140.

The upper active region 131 contacts the upper surface of the stress relaxation layer 140, and the side active region 132 contacts the side surface of the stress relaxation layer 140. The second nitride semiconductor layer 120 may be arranged on the upper active region 131.

The thickness and indium content of the side active region 132 may be different from those of the upper active region 131. For example, the thickness of the side active region 132 may be less than the thickness of the upper active region 131. The indium content of the side active region 132 may be smaller than the indium content of the upper active region 131.

The light emitting device 100 according to an embodiment may be a micro-sized light emitting device 100. The active layer 130 may include a nitride semiconductor based on InGaN. In the case of the micro-sized light emitting device 100, the surface leakage current may be reduced by using the nitride semiconductor based on InGaN as the active layer 130.

The active layer 130 may be configured to emit light having a long wavelength. For example, the active layer 130 may emit light having a wavelength of about 500 nm or more. The active layer 130 may emit light having a wavelength of about 620 nm to about 750 nm. The active layer 130 may include indium of about 20% or more. The active layer 130 may include indium of about 35% or more.

The first passivation layer 151 may be arranged on a side surface of the first nitride semiconductor layer 110. The side active region 132 of the active layer 130 may be arranged to contact the first passivation layer 151.

The first passivation layers 151 may include an insulating material. For example, the first passivation layers 151 may include a transparent insulating material. The first passivation layers 151 may include, but is not limited to, one or more insulating materials selected from the group consisting of silicon oxide ($SiO_2$), silicon nitride ($Si_3N_4$), aluminum oxide ($Al_2O_3$), and titanium oxide ($TiO_2$), but is not limited thereto, and various materials having insulating properties may be used.

The second passivation layer 152 may be arranged on a side surface of the first nitride semiconductor layer 110. The second passivation layer 152 may be arranged on the side surface of the second nitride semiconductor layer 120, and the side active regions 132.

The second passivation layer 152 may contact the side surface of the active layer 130 and may contact the side surface of the second nitride semiconductor layer 120. The second passivation layer 152 may extend to contact the side surface of the first passivation layer 151.

The material of the second passivation layer 152 may include an insulating material. The material of the second passivation layer 152 may include a transparent insulating material. For example, the second passivation layers 152 may include, but is not limited to, one or more insulating materials selected from the group consisting of silicon oxide ($SiO_2$), silicon nitride ($Si_3N_4$), aluminum oxide ($Al_2O_3$), and titanium oxide ($TiO_2$), but is not limited thereto, and various materials having insulating properties may be used. The material of the second passivation layer 152 may be the same as the material of the first passivation layer 151.

However, the first and second passivation layers 151 and 152 may be omitted as necessary. For example, as shown in FIG. 12, the first and second passivation layers 151 and 152 are omitted in the light emitting device 100, and the side active region 132A of the active layer 130D may have a structure that covers the side surface of the stress relaxation layer 140 and the side surface of the first nitride semiconductor layer 110.

Figure 12:
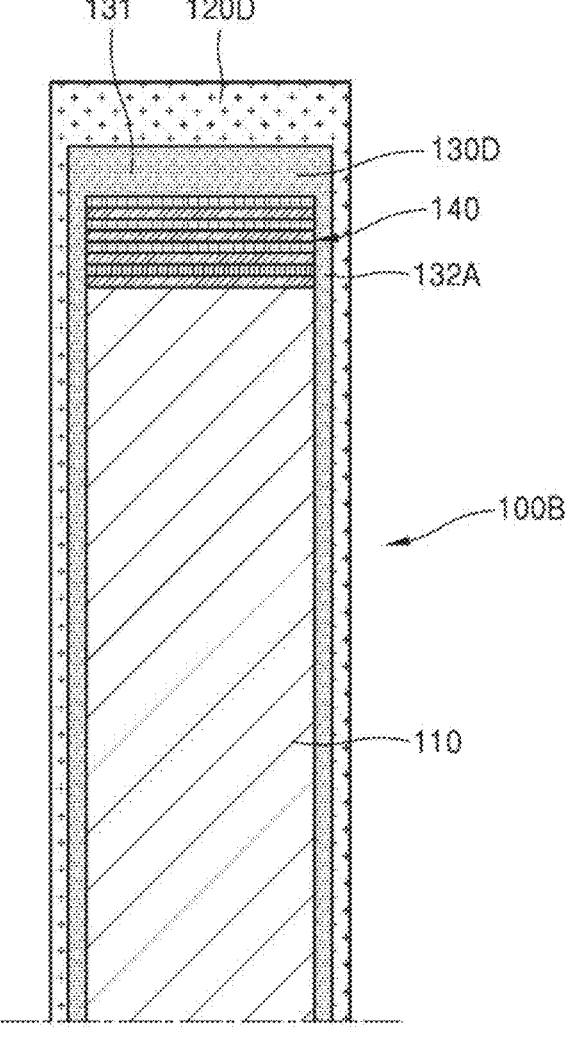
Figure 13:
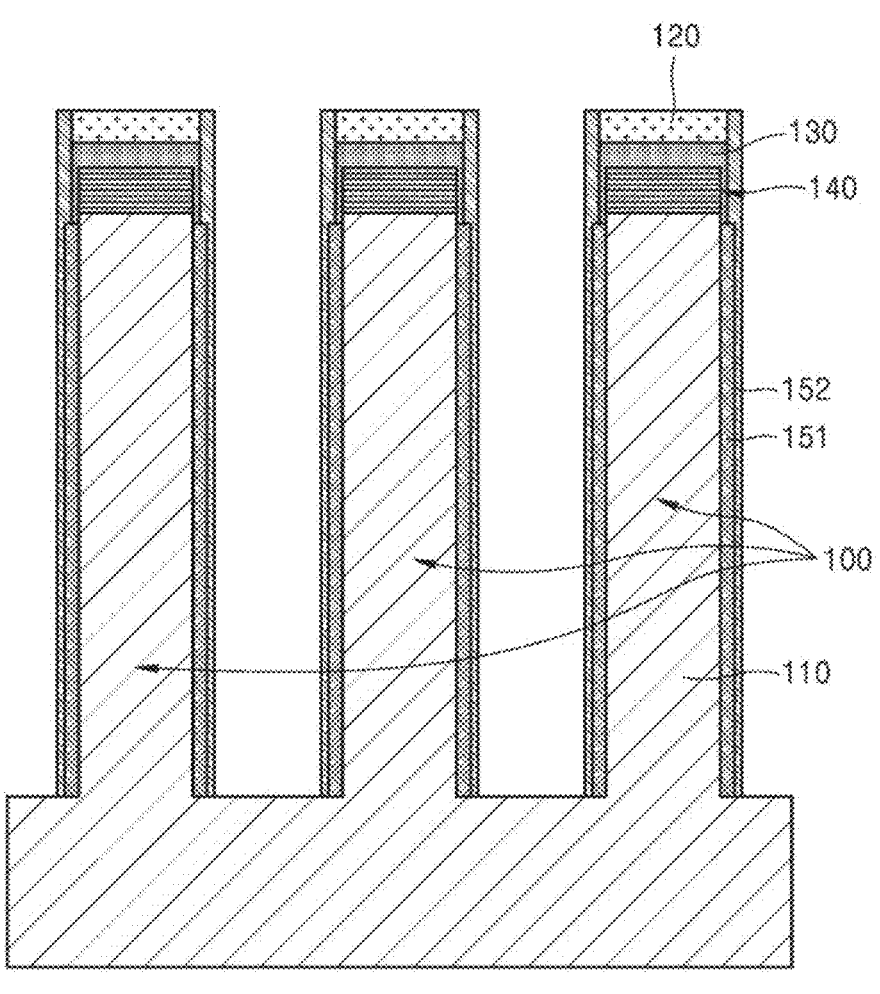
Figure 14:
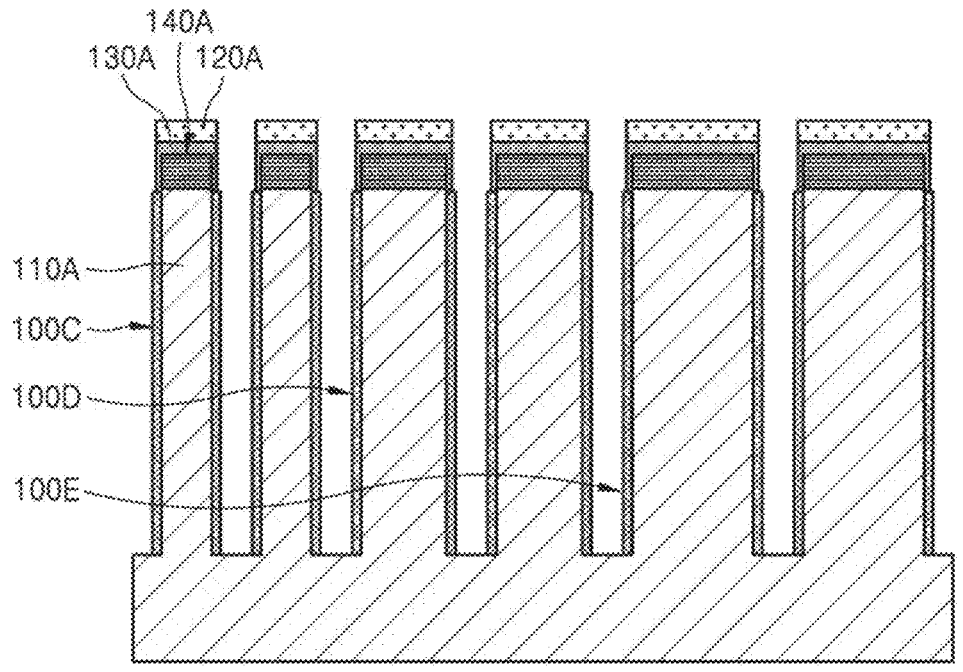

In FIGS. 10 to 12, the examples in which the light emitting devices 100, 100A, and 100B are individually used have been described, but are not necessarily limited thereto. Referring to FIGS. 13 and 14, a plurality of light emitting devices 100 may be provided, and the plurality of light emitting devices 100 may be connected to each other without being separated from each other. As an example, as shown in FIG. 13, the plurality of light emitting devices 100 may include a plurality of active layers 130 spaced apart from each other, and the width and in-between spacing of the plurality of active layers 130 may be constant. As another example, as shown in FIG. 14, the plurality of light emitting devices 100C, 100D, and 100E may include a plurality of active layers 130A formed to be spaced apart from each other, and the plurality of active layers 130A may have different widths. In addition, although not shown, a plurality of light emitting devices 100C, 100D, and 100E may have different spacing tween the active layers 130A.

The above-described light emitting devices 100, 100A, 1008, 100C, 100D, and 100E may be used as light emitting sources of various display apparatuses. For example, the light emitting devices 100, 100A, 1008, 100C, 100D, and 100E may be applied to a lighting apparatus or a self-luminous display apparatus.

Figure 15:
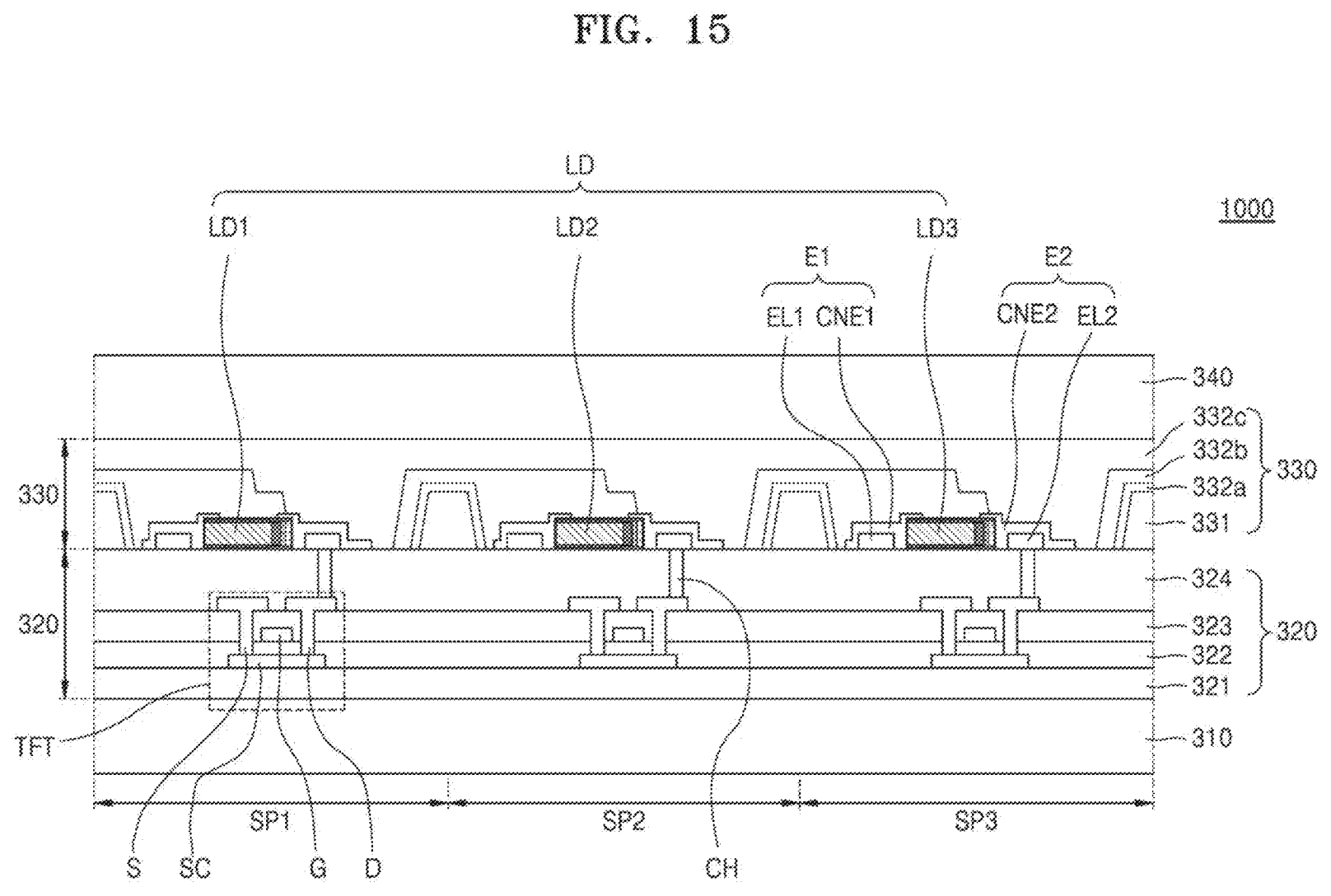

FIG. 15 is a diagram illustrating a portion of a display apparatus including a light emitting device according to an embodiment. Referring to FIG. 15, the display apparatus 1000 may include a substrate 310 on which a plurality of pixels are provided. One pixel may include a first sub-pixel SP1, a second sub-pixel SP2, and a third sub-pixel SP3, which are provided on the substrate 310.

The first to third sub-pixels SP1, SP2, and SP3 may be pixel areas for displaying images in one pixel, and may be light emitting areas from which light is emitted.

Each of the first to third sub-pixels SP1, SP2, and SP3 may include the substrate 310, a driving device layer 320, a display device layer 330, and an overcoat layer 340.

The substrate 310 may include an insulating material such as glass, an organic polymer, crystal, or the like. In addition, the substrate 310 may be made of a flexible material to be bent or folded, and may have a single-layer structure or a multilayer structure.

The driving device layer 320 may include a buffer layer 321 arranged on the substrate 310, a transistor TFT arranged on the buffer layer 321, and a driving voltage wiring.

The buffer layer 321 may prevent impurities from being diffused into a transistor TFT. The buffer layer 321 may be provided as a single layer, but may be provided as a multilayer having at least a double layer or more.

When the buffer layer 321 is provided as a multilayer, each layer may be formed of the same material or different materials. The buffer layer 321 may be omitted depending on the material and process conditions of the substrate 310.

The transistor TFT may drive a corresponding light emitting device among a plurality of light emitting devices LD1, LD2, and LD3 included in the display device layer 330. The transistor TFT may include a semiconductor layer SC, a gate electrode G, a source electrode S, and a drain electrode D.

The semiconductor layer SC may be arranged on the buffer layer 321. The semiconductor layer SC may include a source region contacting the source electrode S and a drain region contacting the drain electrode D. A region between the source region and the drain region may be a channel region.

The semiconductor layer SC may be a semiconductor pattern made of polysilicon, amorphous silicon, oxide semiconductor, or the like. The channel region is a semiconductor pattern that is not doped with impurities, and may be an intrinsic semiconductor. The source region and the drain region may be semiconductor patterns doped with impurities.

The gate electrode G may be provided on the semiconductor layer SC with a gate insulating layer 322 therebetween.

Each of the source electrode S and the drain electrode D may contact the source region and the drain region of the semiconductor layer SC through a contact hole penetrating an interlayer insulating layer 323 and the gate insulating layer 322.

A protective layer 324 may be provided on the transistor TFT.

The display device layer 330 may include the plurality of light emitting devices LD1, LD2, and LD3 provided on the protective layer 324. The light emitting device LD1 in the first sub-pixel SP1 may emit red light, the light emitting device LD2 in the second sub-pixel SP2 may emit green light, and the light emitting device LD3 in the third sub-pixel SP3 may emit blue light. For example, the light emitting device LD1 of the first sub-pixel SP1 may emit light having a wavelength of about 620 nm to about 750 nm, the light emitting device LD2 of the second sub-pixel SP2 may emit light having a wavelength of about 495 nm to about 570 nm, and the light emitting device LD3 of the third sub-pixel SP3 may emit light having a wavelength of about 420 nm to about 495 nm. However, the embodiments are not limited thereto. At least one of the plurality of light emitting devices LD1, LD2, and LD3 may emit light having a wavelength of about 380 nm to 450 nm, or light having a wavelength of about 570 nm to 590 nm or light having a wavelength of about 590 nm to 620 nm. In the process of manufacturing the light emitting devices LD1, LD2, and LD3, the wavelength of the light to be emitted may be changed by adjusting the content of indium.

In the drawings, the light emitting device 100 shown in FIG. 1 is illustrated as the light emitting devices LD1, LD2, and LD3. However, the embodiments are not limited thereto. At least one of the light emitting devices LD1, LD2, and LD3 in the first to third sub-pixels PS1, SP2, and SP3 may have a structure of the light emitting devices 100, 100A, 1008, 100C, 100D, and 100E.

The display device layer 330 may further include a pixel defining layer 331. The pixel defining layer 331 is provided on the protective layer 324, and may partition a light emitting area from each of the first to third sub-pixels SP1, SP2, and SP3. The pixel defining layer 331 may include an opening exposing each of the light emitting devices LD1, LD2, and LD3 respectively included in the first to third sub-pixels SP1, SP2, and SP3.

Two pixel defining layers 331 adjacent to each other on the substrate 310 may be spaced apart from each other by a predetermined interval. For example, the two pixel defining layers 331 adjacent to each other may be spaced apart from each other on the substrate 210 by no less than the length of each of the light emitting devices LD1, LD2, and LD3. The pixel defining layer 331 may be an insulating material including an inorganic material or an organic material, but is not limited thereto.

The pixel defining layer 331 may be an insulating material including an organic material. For example, the pixel defining layer 331 may include polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane based resin, silane based resin, or the like.

A first insulating layer 332*a* may be provided on the pixel defining layer 331. The first insulating layer 332 may cover a part of the upper surface of each of the light emitting devices LD1, LD2, and LD3, which are respectively provided on the first to third sub-pixels SP1, SP2, and SP3. Due to the first insulating layer 332*a*, the first end portion and the second end portion of each of the light emitting devices LD1, LD2, and LD3 may be exposed to the outside.

The first and second electrodes E1 and E2 may be arranged on the protective layer 324. The first electrode E1 may include a first sub-electrode EL1 arranged adjacent to one end of the corresponding light emitting device LD (e.g., the first nitride semiconductor layer 110), and a first contact electrode CNE1 electrically connecting one end of the light emitting device LD with the first sub-electrode EL1. The second electrode E2 may include a second sub-electrode EL2 arranged adjacent to the other end of the corresponding light emitting device LD (e.g., the second nitride semiconductor layer 120) and a second contact electrode CNE2 that electrically connects one end of the light emitting device LD with the second sub-electrode EL2.

Accordingly, the driving voltage may be applied to the corresponding light emitting device LD through the first electrode E1, and the voltage of the transistor TFT may be applied to the corresponding light emitting device LD through the second electrode E2. As a result, the light emitting device LD may emit light as a predetermined voltage is applied to both ends of the light emitting device LD through the first electrode E1 and the second electrode E2. The wavelength of light to be emitted may be different according to the In content of the light emitting device.

A second insulating layer 332*b* and a third insulating layer 332*c* may be provided on the first and second electrodes E1 and E2.

An overcoat layer 340 may be provided on the third insulating layer 332*c*. The overcoat layer 340 may be a planarization layer 150 that alleviates a step generated by components arranged below the overcoat layer 340. In addition, the overcoat layer 340 may be an encapsulation layer that prevents oxygen and moisture from penetrating into the light emitting device.

When the light emitting devices LD1, LD2, and LD3 of the respective sub-pixels SP1, SP2, and SP3 emit light having the same wavelength, the display apparatus may further include a color conversion layer. The color conversion layer may include first to third color conversion patterns. Each of the first to third color conversion patterns may correspond to each sub-pixel. For example, the first color conversion pattern may correspond to the first sub-pixel SP1, the second color conversion pattern may correspond to the second sub-pixel SP2, and the third color conversion pattern may correspond to the third sub-pixel SP3.

Figure 16:
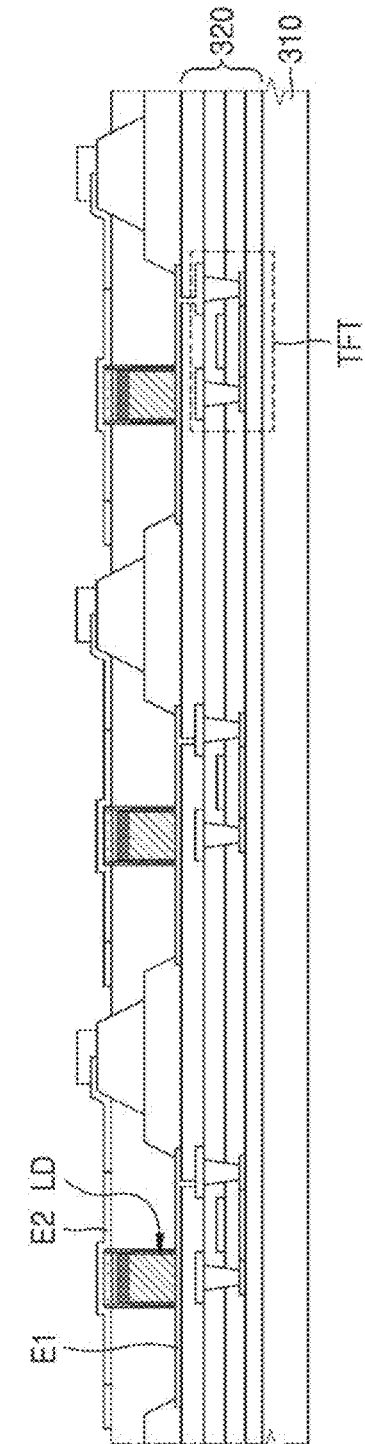
FIG. 16 is a diagram illustrating a portion of a display apparatus according to an embodiment.

FIG. 16 is a diagram illustrating a portion of a display apparatus according to an embodiment. When comparing FIGS. 15 and 16, the first semiconductor layer, the active layer, and the second semiconductor layer of the light emitting device LD shown in FIG. 16 may be sequentially arranged in the thickness direction of the substrate 410.

Figure 17:
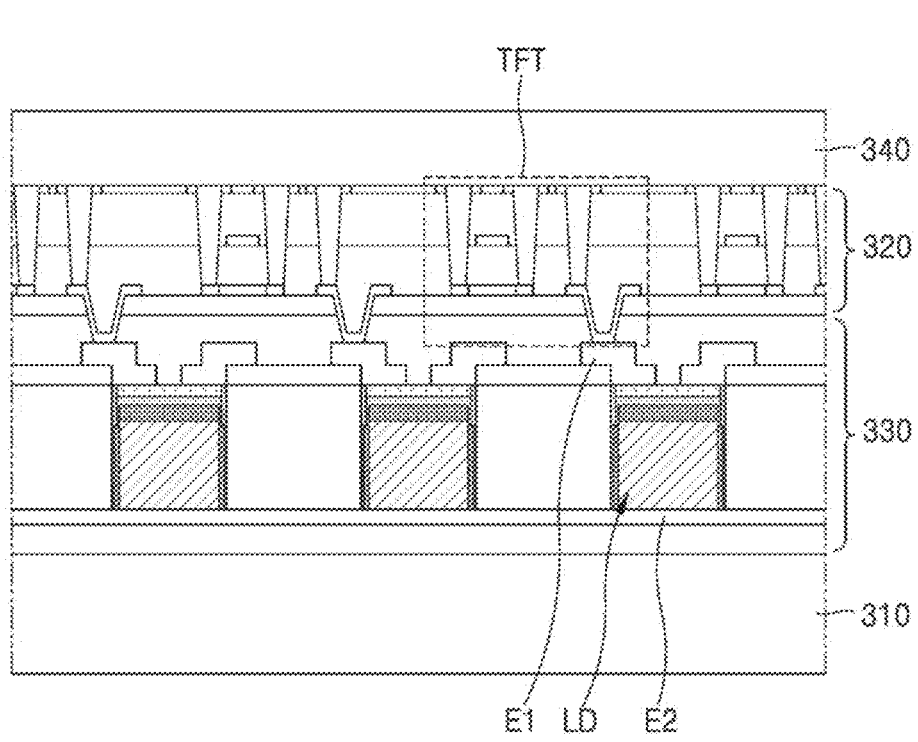
FIG. 17 is a diagram illustrating a portion of a display apparatus according to an embodiment.

FIG. 17 is a diagram illustrating a portion of a display apparatus according to an embodiment. As shown in FIG.

17, a display device layer 330, a driving device layer 320, and an overcoat layer 340 may be sequentially arranged on a substrate 310. When comparing FIGS. 16 and 17, the display device layer 330 may be arranged between the substrate 310 and the driving device layer 320. The display apparatus of FIG. 17 may be implemented as a rear light emitting type by emitting light of different wavelengths from each of the light emitting devices LD.

The above-described display apparatuses may be applied to various electronic apparatuses having a screen display function.

Figure 18:
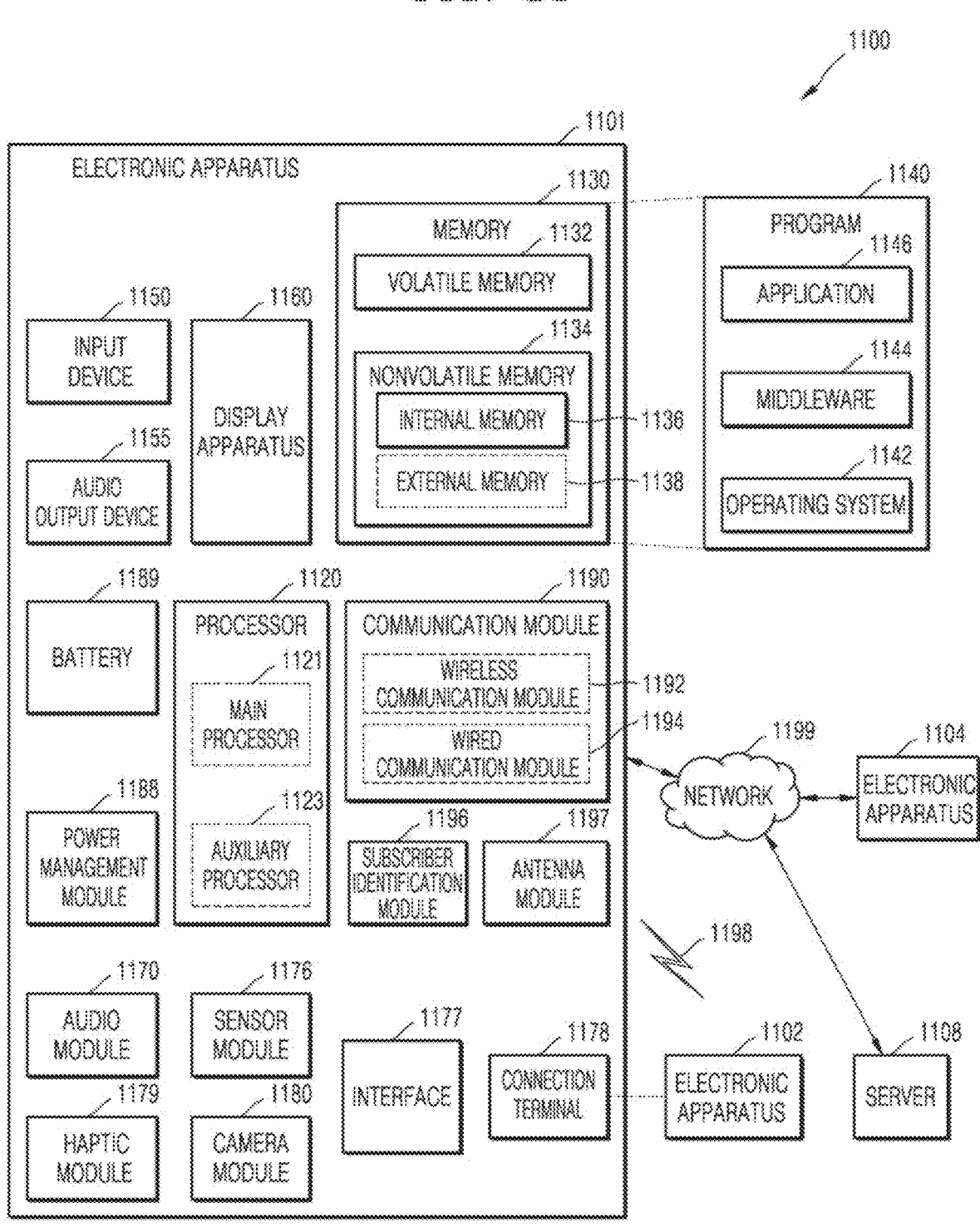
FIG. 18 is a diagram illustrating an electronic apparatus according to an embodiment.

FIG. 18 is a diagram illustrating an electronic apparatus according to an embodiment. Referring to FIG. 18, an electronic apparatus 1101 may be provided in a network environment 1100. In the network environment 1100, the electronic apparatus 1101 may communicate with another electronic apparatus 1102 through a first network 1198 (such as a short-range wireless communication network) or another electronic apparatus 1104 and/or server 1108 through a second network 1199 (such as a long-range wireless communication network). The electronic apparatus 1101 may communicate with the electronic apparatus 1104 through the server 1108. The electronic apparatus 1101 may include a processor 1120, a memory 1130, an input device 1150, an audio output device 1155, a display apparatus 1160, an audio module 1170, a sensor module 1176, an interface 1177, a haptic module 1179, a camera module 1180, a power management module 1188, a battery 1189, a communication module 1190, a subscriber identification module 1196 and/or an antenna module 1197. Some of these components may be omitted from or other components may be added to the electronic apparatus 1101. Some of these components may be implemented as one integrated circuit. For example, the sensor module 1176 (fingerprint sensor, iris sensor, illumination sensor, etc.) may be implemented by being embedded in the display apparatus 1160 (display, etc.).

The processor 1120 may execute software (program 1140 or the like) to control one or a plurality of other components (hardware, software components, etc.) of the electronic apparatus 1101 connected to the processor 1120, and may perform various data processing or operations. As part of data processing or operation, the processor 1120 may load commands and/or data received from other components (sensor modules 1176, communication modules 1190, etc.), process commands and/or data stored in volatile memory 1132, and store the result data in nonvolatile memory 1134. The nonvolatile memory 1134 may include an internal memory 1136 mounted in the electronic apparatus 1101 and a detachable external memory 1138. The processor 1120 may include a main processor 1121 (a central processing unit, an application processor, etc.) and an auxiliary processor 1123 (a graphics processing unit, an image signal processor, a sensor hub processor, a communication processor, etc.) that may be operated independently of or together with the main processor 1121. The auxiliary processor 1123 may use less power than the main processor 1121 and perform a specialized function.

The auxiliary processor 1123 may control the functionality and/or status associated with some of the components of the electronic apparatus 1101 (the display apparatus 1160, the sensor module 1176, the communication module 1190, etc.), in place of the main processor 1121 while the main processor 1121 is in an inactive state (sleep state), or in conjunction with the main processor 1121 while the main processor 1121 is in an active state (application execution state). The auxiliary processor 1123 (image signal processor, communication processor, etc.) may be implemented as part of other functionally related components (camera module 1180, communication module 1190, etc.).

The memory 1130 may store various data required by components (processor 1120 and sensor module 1176) of the electronic apparatus 1101. The data may include, for example, input data and/or output data for software (program 1140 or the like) and related commands. The memory 1130 may include a volatile memory 1132 and/or a non-volatile memory 1134.

The program 1140 may be stored in the memory 1130 as software, and may include an operating system 1142, middleware 1144, and/or an application 1146.

The input device 1150 may receive commands and/or data to be used in components (processor 1120, etc.) of the electronic apparatus 1101 from the outside (user, etc.) of the electronic apparatus 1101. The input device 1150 may include a remote controller, a microphone, a mouse, a keyboard, and/or a digital pen (such as a stylus pen).

The audio output device 1155 may output the sound signal to the outside of the electronic apparatus 1101. The audio output device 1155 may include a speaker and/or a receiver. Speakers may be used for general purposes such as multimedia playback or recording playback, and receivers may be used to receive incoming calls. The receiver may be coupled as part of a speaker or may be implemented as an independent separate device.

The display apparatus 1160 may visually provide information to the outside of the electronic apparatus 1101. The display apparatus 1160 may include a display, a hologram device, or a projector and a control circuit for controlling the corresponding device. The display apparatus 1160 may include the above-described driving circuit, the micro-semiconductor light emitting device 100, a side reflection structure, a lower reflection structure, and the like. The display apparatus 1160 may further include a touch circuit configured to sense a touch, and/or a sensor circuit (a pressure sensor, etc.) configured to measure an intensity of a force generated by the touch.

The audio module 1170 may convert sound into an electrical signal or conversely convert the electrical signal into sound. The audio module 1170 may acquire sound through the input device 1150 or output sound through the audio output device 1155 and/or a speaker and/or a headphone of another electronic apparatus (e.g., electronic apparatus 1102, etc.) directly or wirelessly connected to the electronic apparatus 1101.

The sensor module 1176 may detect an operating state (power, temperature, etc.) or an external environmental state (user state, etc.) of the electronic apparatus 1101 and generate an electrical signal and/or a data value corresponding to the sensed state. The sensor module 1176 may include a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, and/or an illumination sensor.

The interface 1177 may support one or more designated protocols that may be used for electronic apparatus 1101 to be directly or wirelessly connected to another electronic apparatus (e.g., electronic apparatus 1102, etc.). The interface 1177 may include a high definition multimedia interface (HDMI), a universal serial bus (USB) interface, an SD card interface, and/or an audio interface.

The connection terminal 1178 may include a connector through which the electronic apparatus 1101 may be physically connected to another apparatus (e.g., electronic apparatus 1102, etc.). The connection terminal 1178 may include an HDMI connector, a USB connector, an SD card connector, and/or an audio connector (such as a headphone connector, etc.).

The haptic module 1179 may convert an electrical signal to a mechanical stimulus (vibration, motion, etc.) or an electrical stimulus that a user can recognize through a tactile or motion sensation. The haptic module 1179 may include a motor, a piezoelectric element, and/or an electrical stimulus.

The camera module 1180 may capture a still image and a moving image. The camera module 1180 may include a lens assembly including one or more lenses, image sensors, image signal processors, and/or flashes. The lens assembly included in the camera module 1180 may collect light emitted from an object to be photographed.

The power management module 1188 may manage power supplied to the electronic apparatus 1101. The power management module 1188 may be implemented as part of a power management integrated circuit (PMIC).

The battery 1189 may supply power to components of the electronic apparatus 1101. The battery 1189 may include a non-rechargeable primary battery, a rechargeable secondary battery, and/or a fuel cell.

The communication module 1190 may establish a direct (wired) communication channel and/or wireless communication channel between the electronic apparatus 1101 and another electronic apparatus (the electronic apparatus 1102, the electronic apparatus 1104, the server 1108, etc.), and support communication execution through the established communication channel. The communication module 1190 may include one or more communication processors that operate independently of the processor 1120 (application processor, etc.) and support direct communication and/or wireless communication. The communication module 1190 may include a wireless communication module 1192 (a cellular communication module, a short-range wireless communication module, a Global Navigation Satellite System (GNSS), etc.) communication module, and/or a wired communication module 1194 (a local area network (LAN) communication module, a power line communication module, etc.). A corresponding communication module of these communication modules may communicate with other electronic apparatuses through a first network 1198 (a short-range communication network such as Bluetooth, WiFi Direct, or infrared data association (IrDA)), or a second network 1199 (a long-range communication network such as a cellular network, Internet, or computer network (LAN, wide area network (WAN), etc.)). These various types of communication modules may be integrated into a single component (such as a single chip, etc.), or may be implemented as a plurality of separate components (multiple chips). The wireless communication module 1192 may identify and authenticate the electronic apparatus 1101 in a communication network such as a first network 1198 and/or a second network 1199 using subscriber information (such as an international mobile subscriber identifier (IMSI) stored in the subscriber identification module 1196.

The antenna module 1197 may transmit a signal and/or power to the outside (such as another electronic apparatus, etc.) or receive the signal and/or power from the outside. The antenna may include a radiator formed of a conductive pattern formed on the substrate (printed circuit board (PCB), etc.). The antenna module 1197 may include one or a plurality of antennas. When a plurality of antennas are included, an antenna suitable for a communication scheme used in a communication network such as a first network 1198 and/or a second network 1199 may be selected from among the plurality of antennas by the communication module 1190. A signal and/or power may be transmitted or received between the communication module 1190 and another electronic apparatus through the selected antenna. Other components (radio frequency integrated circuit (RFIC), etc.) in addition to the antenna may be included as a part of the antenna module 1197.

Some of the components are connected to each other and may exchange signals (commands, data, etc.) via a communication scheme (bus, General Purpose Input and Output (GPIO), Serial Peripheral Interface (SPI), Mobile Industry Processor Interface (MIPI), etc.) and can interchange signals (commands, data, etc.) between peripherals.

The command or data may be transmitted or received between the electronic apparatus 1101 and the external electronic apparatus 1104 through the server 1108 connected to the second network 1199. Other electronic apparatuses 1102 and 1104 may be the same or different types of apparatuses as the electronic apparatus 1101. All or some of the operations executed in the electronic apparatus 1101 may be executed in one or more of the other electronic apparatuses 1102, 1104, and 1108. For example, when the electronic apparatus 1101 needs to perform a function or service, it may request one or more other electronic apparatuses to perform part or all of the function or service instead of executing the function or service on its own. One or more other electronic apparatuses receiving the request may execute an additional function or service related to the request and transmit a result of the execution to the electronic apparatus 1101. To this end, cloud computing, distributed computing, and/or client-server computing technology may be used.

Figure 19:
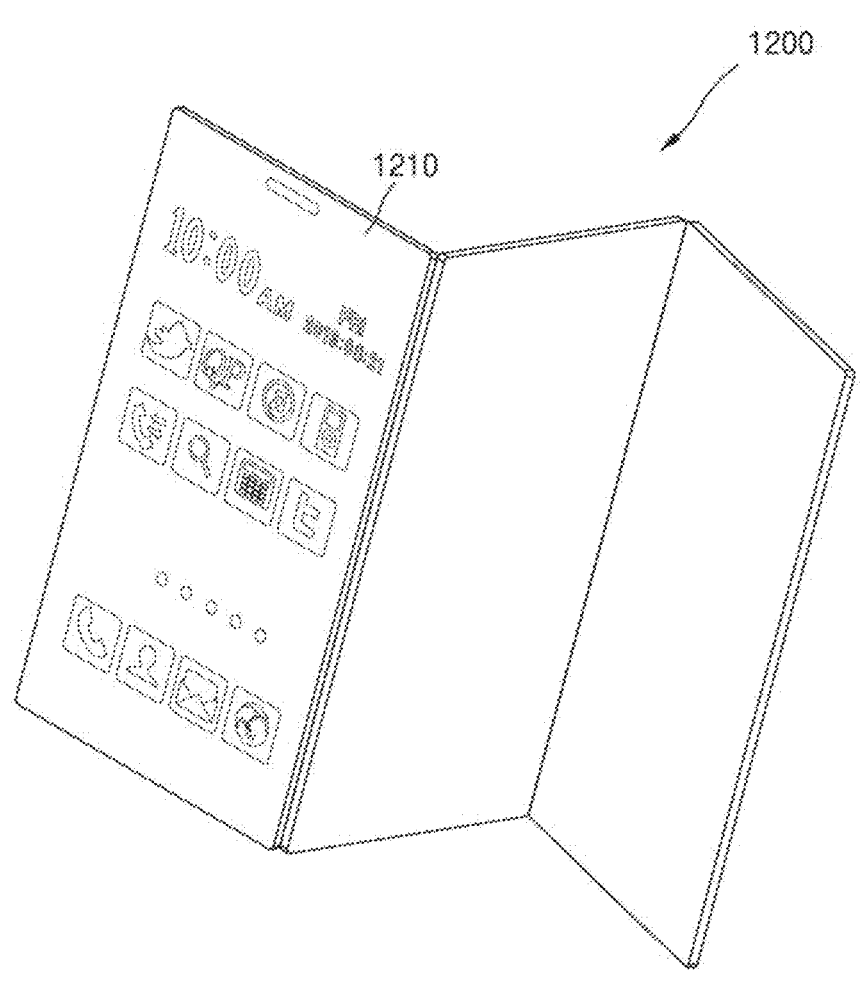
FIG. 19 is a diagram illustrating an example in which a display apparatus according to embodiments is applied to a mobile apparatus.

FIG. 19 is a diagram illustrating an example in which a display apparatus according to embodiments is applied to a mobile apparatus. The mobile apparatus 1200 may include a display apparatus 1210, and the display apparatus 1210 may include the driving circuit, the light emitting devices 100, 100A, 1008, 100C, 100D, and 100E, a side reflection structure, and a lower reflection structure. The display apparatus 1210 may have a foldable structure, for example, a multi-foldable structure.

Figure 20:
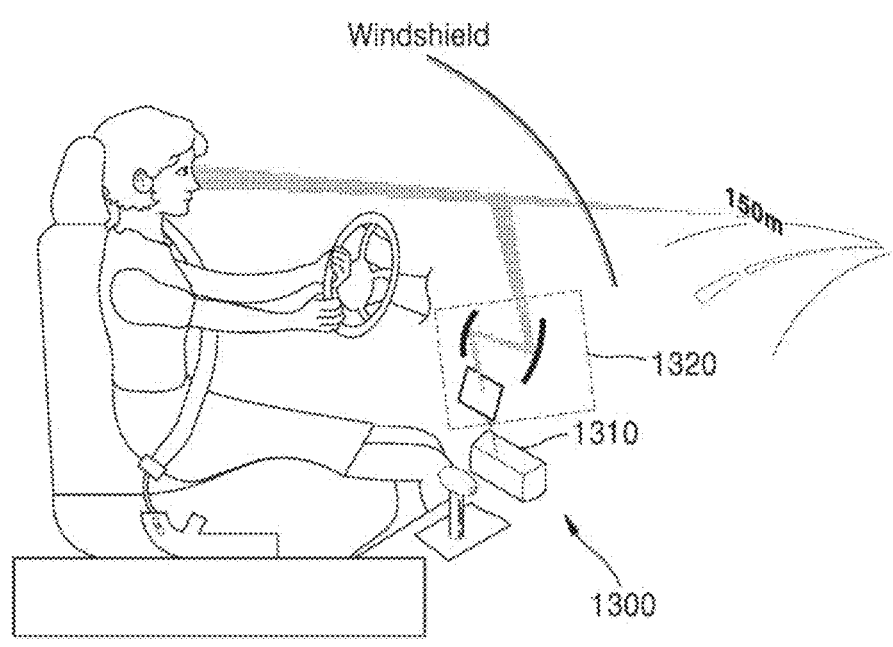
FIG. 20 is a diagram illustrating an example in which a display apparatus according to embodiments is applied to a vehicle display apparatus.

FIG. 20 is a diagram illustrating an example in which a display apparatus according to embodiments is applied to a vehicle display apparatus. The display apparatus may be a head-up display apparatus 1300 for a vehicle, and may include a display 1310 provided in one area of the vehicle and an optical path changing member 1320 that converts an optical path so that a driver may see an image generated by the display 1310.

Figure 21:
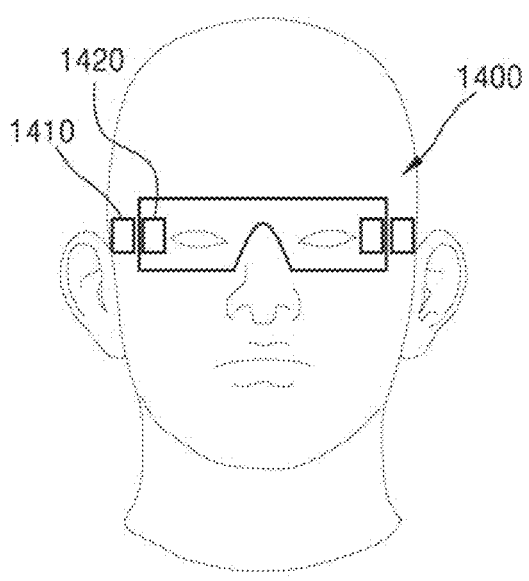
FIG. 21 is a diagram illustrating an example in which a display apparatus according to embodiments is applied to augmented reality glasses or virtual reality glasses.

FIG. 21 is a diagram illustrating an example in which a display apparatus according to an embodiment is applied to augmented reality glasses or virtual reality glasses. The augmented reality glasses 1400 may include a projection system 1410 forming an image and an element 1420 guiding an image from the projection system 1410 to enter the user's eye. The projection system 1410 may include the above-described driving circuit, the micro-semiconductor light emitting device 100, a side reflection structure, a lower reflection structure, and the like.

Figure 22:
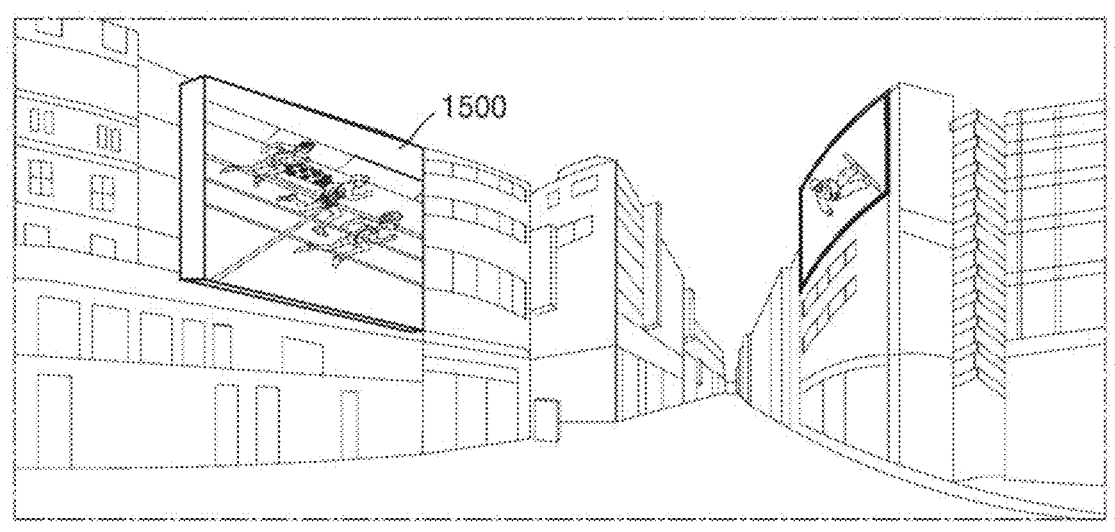
FIG. 22 is a diagram illustrating an example in which a display apparatus according to embodiments is applied to a signage.

FIG. 22 is a diagram illustrating an example in which a display apparatus according to embodiments is applied to a signage. The signage 1500 may be used for outdoor advertising using a digital information display, and may control advertising content, etc. through a communication network. The signage 1500 may be implemented, for example, through the electronic apparatus described with reference to FIG. 22.

Figure 23:
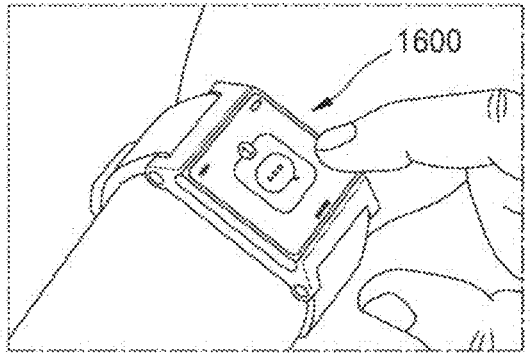
FIG. 23 is a diagram illustrating an example in which a display apparatus according to embodiments is applied to a wearable display.

FIG. 23 is a diagram illustrating an example in which a display apparatus according to embodiments is applied to a wearable display. The wearable display 1600 may include the above-described driving circuit, the micro-semiconductor light emitting device 100, a side reflection structure, a lower reflection structure, and the like, and may be implemented through the electronic apparatus described with reference to FIG. 23.

The display apparatus in accordance with an example embodiment may be applied to various products such as a rollable television (TV), a stretchable display, and the like.

The light emitting device and the method of manufacturing the same according to the disclosed embodiment may improve the light emitting efficiency of the light emitting device by forming the active layer on the stress relaxation layer on which the stress is relieved by etching. The display apparatus according to the disclosed embodiment may emit high-efficiency light.

An active layer may include InGaN for light extraction of a long wavelength of a micro LED, and a stress relaxation layer may be formed by etching the stress base layer before growing the active layer to reduce crystal defects of the active layer. Since the active layer is grown after the stress relaxation layer is formed, the active layer may have a structure including an upper active region arranged on an upper surface of the stress relaxation layer and a side active region arranged on a side surface of the stress relaxation layer.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A light emitting device comprising:

a first nitride semiconductor layer doped with an n-type dopant and having a first lattice constant;

an active layer provided on the first nitride semiconductor layer and having a second lattice constant greater than the first lattice constant, the active layer comprising a nitride semiconductor material comprising indium;

a stress relaxation layer interposed between the first nitride semiconductor layer and the active layer and having a third lattice constant between the first lattice constant and the second lattice constant, the stress relaxation layer comprising a nitride semiconductor material comprising indium; and a second nitride semiconductor layer provided on the active layer and doped with a p-type dopant, wherein the active layer comprises:

an upper active region provided on an upper surface of the stress relaxation layer, and a side active region comprising a side surface directly contacting a side surface of the stress relaxation layer and a side surface of the first nitride semiconductor layer, wherein the light emitting device has a width in a first direction that is less than a length thereof in a second direction perpendicular to the first direction, and wherein the side surface of the stress relaxation layer, the side surface of the first nitride semiconductor layer and the side surface of the side active region are aligned in the second direction.

2. The light emitting device of claim 1, wherein, in the stress relaxation layer, a fourth lattice constant of a region facing the active layer is greater than a fifth lattice constant of a region facing the first nitride semiconductor layer, and wherein a difference between the fourth lattice constant and the fifth lattice constant in the stress relaxation layer is about 1% or more of the first lattice constant.

3. The light emitting device of claim 1, wherein, in the active layer, a thickness of the side active region in the first direction is less than a thickness of the upper active region in the second direction.

4. The light emitting device of claim 1, further comprising a first passivation layer provided on the side surface of the first nitride semiconductor layer, wherein the side active region contacts the first passivation layer.

5. The light emitting device of claim 1, wherein the stress relaxation layer comprises InGaN, and wherein the active layer comprises InGaN.

6. The light emitting device of claim 1, wherein an indium content of the stress relaxation layer is less than an indium content of the active layer.

7. The light emitting device of claim 1, wherein the active layer comprises an indium content of about 20% or more such that the active layer is configured to emit long-wavelength light.

8. The light emitting device of claim 1, wherein a width of the active layer is about 10 μm or less.

9. The light emitting device of claim 1, wherein the second nitride semiconductor layer is provided on the upper active region.

10. The light emitting device of claim 1, wherein the active layer comprises a plurality of active layers spaced apart from each other.

11. The light emitting device of claim 10, wherein the plurality of active layers have different widths.

12. The light emitting device of claim 10, wherein the second nitride semiconductor layer connects the plurality of active layers to each other.

13. The light emitting device of claim 1, wherein the stress relaxation layer comprises a superlattice layer comprising a plurality of thin film layers having a thickness of about 10 nm or less.

14. The light emitting device of claim 1, wherein the stress relaxation layer comprises a single layer having an indium content of about 20% or less and a thickness of about 10 nm or less.

15. A display apparatus comprising:

a light emitting device comprising:

a first nitride semiconductor layer doped with an n-type dopant and having a first lattice constant;

an active layer provided on the first nitride semiconductor layer and having a second lattice constant greater than the first lattice constant, the active layer comprising a nitride semiconductor material comprising indium;

a stress relaxation layer interposed between the first nitride semiconductor layer and the active layer and having a third lattice constant between the first lattice constant and the second lattice constant, the stress relaxation layer comprising a nitride semiconductor material comprising indium; and a second nitride semiconductor layer provided on the active layer and doped with a p-type dopant, wherein the active layer comprises:

an upper active region provided on an upper surface of the stress relaxation layer, and a side active region comprising a side surface directly contacting a side surface of the stress relaxation layer and a side surface of the first nitride semiconductor layer, wherein the light emitting device has a width in a first direction that is less than a length thereof in a second direction perpendicular to the first direction, and wherein the side surface of the stress relaxation layer, the side surface of the first nitride semiconductor layer and the side surface of the side active region are aligned in the second direction.

* * * * *